(12) United States Patent
Ikeda

(10) Patent No.: US 11,196,948 B2
(45) Date of Patent: Dec. 7, 2021

(54) PHOTO-DETECTION DEVICE AND IMAGING SYSTEM

(71) Applicant: CANON KABUSHIKI KAISHA, Tokyo (JP)

(72) Inventor: Hajime Ikeda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 201 days.

(21) Appl. No.: 16/711,991

(22) Filed: Dec. 12, 2019

(65) Prior Publication Data

US 2020/0213542 A1 Jul. 2, 2020

(30) Foreign Application Priority Data

Dec. 27, 2018 (JP) .............................. JP2018-244016

(51) Int. Cl.
*H04N 5/357* (2011.01)
*H01L 27/146* (2006.01)
*H01L 31/107* (2006.01)
*H04N 13/271* (2018.01)
*H04N 5/353* (2011.01)
(Continued)

(52) U.S. Cl.
CPC ....... *H04N 5/357* (2013.01); *H01L 27/14609* (2013.01); *H01L 27/14612* (2013.01); *H01L 27/14627* (2013.01); *H01L 31/107* (2013.01); *H04N 5/3532* (2013.01);
(Continued)

(58) Field of Classification Search
CPC .... H04N 5/357; H04N 13/271; H04N 5/3532; H04N 2013/0081; H04N 5/353; H04N 5/378; H04N 5/3745; H04N 5/37452; H01L 27/14612; H01L 27/14609; H01L 31/107; H01L 27/14627; B60R 11/04; B60Q 9/008
See application file for complete search history.

(56) References Cited

U.S. PATENT DOCUMENTS 6,392,282 B1 *  5/2002  Sahara ................ H01L 27/1443
                                                           257/186
10,453,879 B2   10/2019  Ikeda
(Continued)

FOREIGN PATENT DOCUMENTS

JP       2013-247289       12/2013

OTHER PUBLICATIONS

U.S. Appl. No. 16/716,668, filed Dec. 17, 2019 by Hajime Ikeda et al.

(Continued)

*Primary Examiner* — Tony Ko
(74) *Attorney, Agent, or Firm* — Venable LLP

(57) ABSTRACT

A photo-detection device in one embodiment includes: a first semiconductor region that accumulates a signal charge based on an incident light; a second semiconductor region that is capable of accumulating a signal charge, the number of signal charges that can be accumulated in the second semiconductor region being less than the number of signal charges that can be accumulated in the first semiconductor region; a first gate that transfers the signal charge from the first semiconductor region to the second semiconductor region; and a charge multiplication unit that includes a third semiconductor region and avalanche-multiplies the signal charge transferred from the second semiconductor region to the third semiconductor region.

22 Claims, 15 Drawing Sheets

(51) Int. Cl.
  *B60R 11/04* (2006.01)
  *H04N 13/00* (2018.01)
  *B60Q 9/00* (2006.01)
(52) U.S. Cl.
  CPC ........... *H04N 13/271* (2018.05); *B60Q 9/008* (2013.01); *B60R 11/04* (2013.01); *H04N 2013/0081* (2013.01)

(56) References Cited

U.S. PATENT DOCUMENTS

| | | |
|---|---|---|
| 10,535,688 B2 | 1/2020 | Onuki |
| 10,536,653 B2 | 1/2020 | Ikeda |
| 2009/0184384 A1 | 7/2009 | Sanfilippo |
| 2014/0299747 A1 | 10/2014 | Tachino |
| 2017/0212221 A1 | 7/2017 | Goden |
| 2018/0374886 A1 | 12/2018 | Iwata |
| 2019/0037161 A1 | 1/2019 | Ikeda |
| 2021/0134862 A1* | 5/2021 | Ishida ................... H01L 31/107 |

OTHER PUBLICATIONS

U.S. Appl. No. 16/708,079, filed Dec. 9, 2019 by Yusuke Onuki et al.
U.S. Appl. No. 16/780,666, filed Feb. 3, 2020 by Fumihiro Inui et al.

* cited by examiner

PHOTO-DETECTION DEVICE AND IMAGING SYSTEM

BACKGROUND

Field

The present disclosure relates to a photo-detection device and an imaging system.

Description of the Related Art

Conventionally, a photo-detection device using a Single-photon Avalanche Diode (SPAD) is known. An SPAD is an element that counts the number of incident photons by detecting an avalanche current that arises in response to incidence of a single photon. A reverse bias voltage above the breakdown voltage is applied to the avalanche diode, and a current is multiplied by avalanche multiplication. The photo-detection device including an SPAD counts the number of times that the current multiplied by avalanche multiplication (hereafter, referred to as "avalanche current") exceeds a threshold.

In an SPAD disclosed in the specification of U.S. Patent Application Publication No. 2009/0184384, generation of signal charges caused by photon incidence and avalanche multiplication of the generated signal charges are performed in the same region. Specifically, generation and avalanche multiplication of signal charges are performed inside a depletion layer in which only the electric field directed to a charge collection region occurs. With such a configuration, in response to generation of signal charges, an avalanche current is generated.

An avalanche photodiode may avalanche-multiply not only signal charges generated by photon incidence but also charges generated due to a different factor from photon incidence (hereafter, referred to as "unnecessary charge"). Avalanche multiplication of an unnecessary charge causes noise.

In the SPAD disclosed in the specification of U.S. Patent Application Publication No. 2009/0184384, generation and avalanche multiplication of signal charges are performed in the same region. As a period for detecting an incident light becomes longer, a period in which a large reverse bias voltage is applied becomes longer. As a result, unnecessary charges are avalanche-multiplied, and the number of detected times may increase. Therefore, in the SPAD disclosed in the specification of U.S. Patent Application Publication No. 2009/0184384 has a problem of noise being likely to increase.

SUMMARY

The object of the present disclosure is to provide a photo-detection device and an imaging system that can reduce noise due to unnecessary charges.

According to one disclosure of the present disclosure, provided is a photo-detection device including: a first semiconductor region that accumulates a signal charge based on an incident light; a second semiconductor region that is capable of accumulating a signal charge, the number of signal charges that can be accumulated in the second semiconductor region being less than the number of signal charges that can be accumulated in the first semiconductor region; a first gate that transfers the signal charge from the first semiconductor region to the second semiconductor region; and a charge multiplication unit that includes a third semiconductor region and avalanche-multiplies the signal charge transferred from the second semiconductor region to the third semiconductor region.

Further features of the present disclosure will become apparent from the following description of exemplary embodiments with reference to the attached drawings.

DESCRIPTION OF THE EMBODIMENTS

First Embodiment

A photo-detection device in a first embodiment of the present disclosure will be described by using FIG. 1 to FIG. 8.

Figure 1:
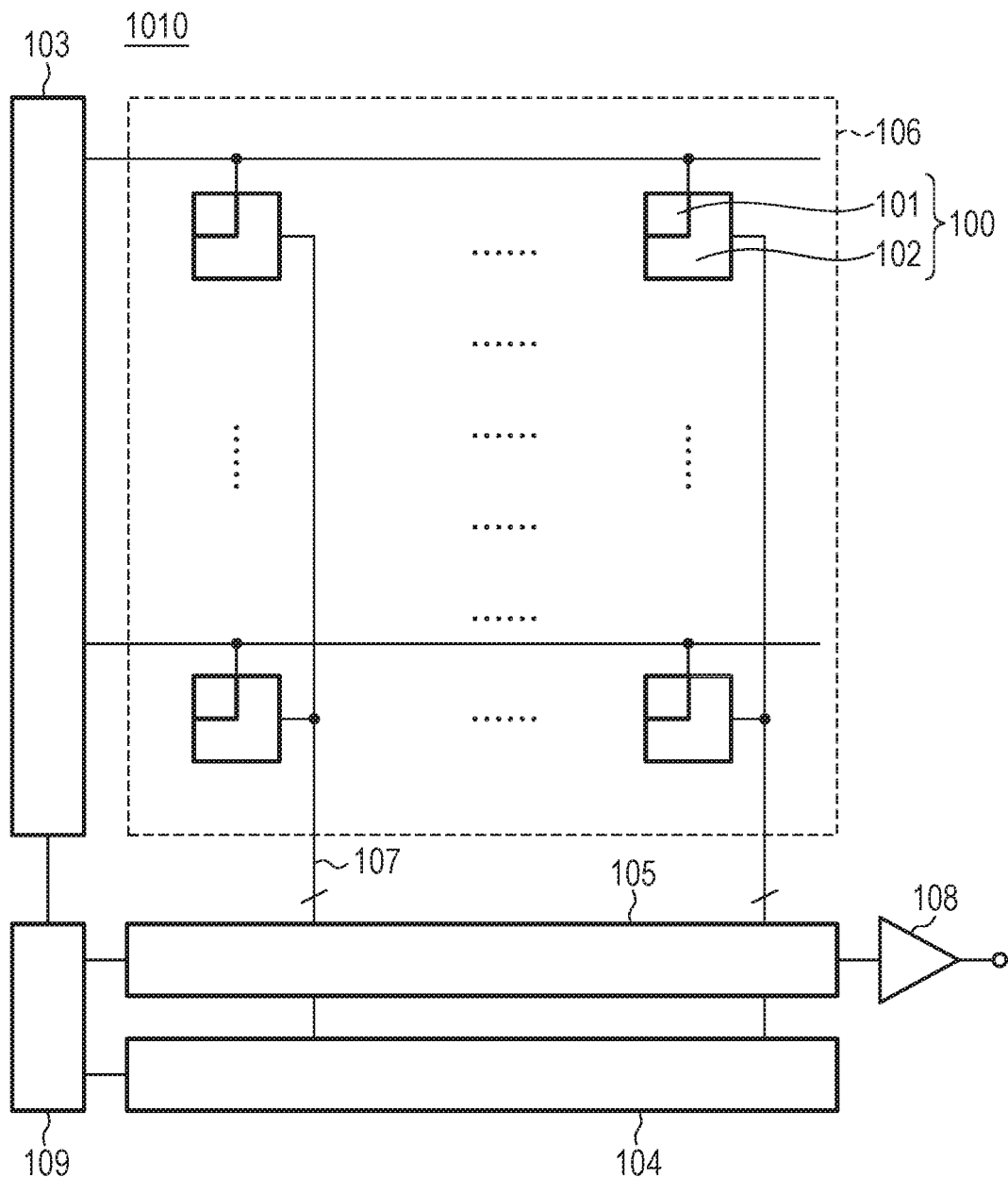
FIG. 1 is a block diagram illustrating a general configuration of a photo-detection device in a first embodiment of the present disclosure.

FIG. 1 is a block diagram illustrating a general configuration of the photo-detection device in the present embodiment. A photo-detection device 1010 has a vertical select circuit 103, a horizontal select circuit 104, a column circuit 105, a pixel unit 106, signal lines 107, an output circuit 108, and a control circuit 109.

The pixel unit 106 has a plurality of pixels 100 arranged in a matrix. Each of the pixels 100 includes a photoelectric conversion element 101 and a pixel signal processing unit 102. The photoelectric conversion element 101 photoelectrically converts an incident light into an electrical signal. The pixel signal processing unit 102 outputs the converted electrical signal to the column circuit 105.

Note that, in this specification, "light" may include electromagnetic waves having any wavelengths. That is, "light" is not limited to visible light but may include invisible light such as an infrared ray, an ultraviolet ray, an X ray, a gamma ray, or the like.

The control circuit 109 generates control pulses that drive the vertical select circuit 103, the horizontal select circuit 104, and the column circuit 105 and supplies the control pulses to each unit thereof. Thereby, the control circuit 109 performs control of the drive timing or the like of each unit.

The vertical select circuit 103 supplies control signals to each of the plurality of pixels 100 based on control signals supplied from the control circuit 109. As illustrated in FIG. 1, the vertical select circuit 103 supplies control signals on a row basis to respective pixels 100 via control signal lines provided on a row basis of the pixel unit 106. In the vertical select circuit 103, a logic circuit such as a shift register, an address decoder, or the like may be used.

The signal lines 107 are provided on a column basis of the pixel unit 106 and transmit signals output from the pixels 100 on a row selected by the vertical select circuit 103 to the column circuit 105 on the post-stage of the pixels 100 as digital signals. The column circuit 105 performs a predetermined process on a signal of each pixel 100 input via the signal line 107. A predetermined process is a process such as noise removal, amplification, conversion of an output form, or the like of an input signal, for example. To implement these functions, the column circuit 105 may have a parallel-to-serial converter circuit or the like.

The horizontal select circuit 104 supplies, to the column circuit 105, control pulses used for sequentially outputting signals on which a predetermined process has been performed to the output circuit 108 based on control pulses supplied from the control circuit 109. The output circuit 108 includes a buffer amplifier, a differential amplifier, or the like and outputs, to a storage unit or a signal processing unit outside the photo-detection device 1010, a signal output from the column circuit 105.

The control circuit 109 is a circuit used for supplying control signals that control operations and their timings of the vertical select circuit 103, the horizontal select circuit 104, the column circuit 105, and the output circuit 108. Note that the vertical select circuit 103, the horizontal select circuit 104, the column circuit 105, and the output circuit 108 may be driven by control signals supplied from the outside of the photo-detection device 1010.

In FIG. 1, the arrangement of the pixels 100 within the pixel unit 106 may be one-dimensional, or only a single pixel 100 may be arranged. When the pixels 100 within the pixel unit 106 are divided into several blocks, multiple sets of vertical select circuit 103, the horizontal select circuit 104, and the column circuit 105 may be arranged in association with each block. Further, the horizontal select circuit 104 and the column circuit 105 may be arranged on a column basis.

The pixel signal processing units 102 are not necessarily required to be provided in a one-to-one manner in all the pixels 100. For example, a single pixel signal processing unit 102 may be shared by a plurality of pixels 100. In such a case, the pixel signal processing unit 102 provides the function of signal processing on each pixel by sequentially processing signals output from respective photoelectric conversion elements 101.

Further, the pixel signal processing unit 102 may be provided on a different semiconductor substrate from a semiconductor substrate on which the photoelectric conversion element 101 is provided. In such a case, it is possible to improve sensitivity by improving the ratio of the area that can receive light by the photoelectric conversion element 101 (aperture ratio). The photoelectric conversion element 101 and the pixel signal processing unit 102 are electrically connected to the signal line 107 via a connection wiring provided on a pixel 100 basis. Each of the signal lines 107 may include n signal lines that transmit an n-bit digital signal. Note that, in the same manner as the pixel signal processing unit 102, the vertical select circuit 103, the horizontal select circuit 104, the column circuit 105, and the signal lines 107 may be provided on a different semiconductor substrate from a semiconductor substrate on which the photoelectric conversion element 101 is provided.

Figure 2:
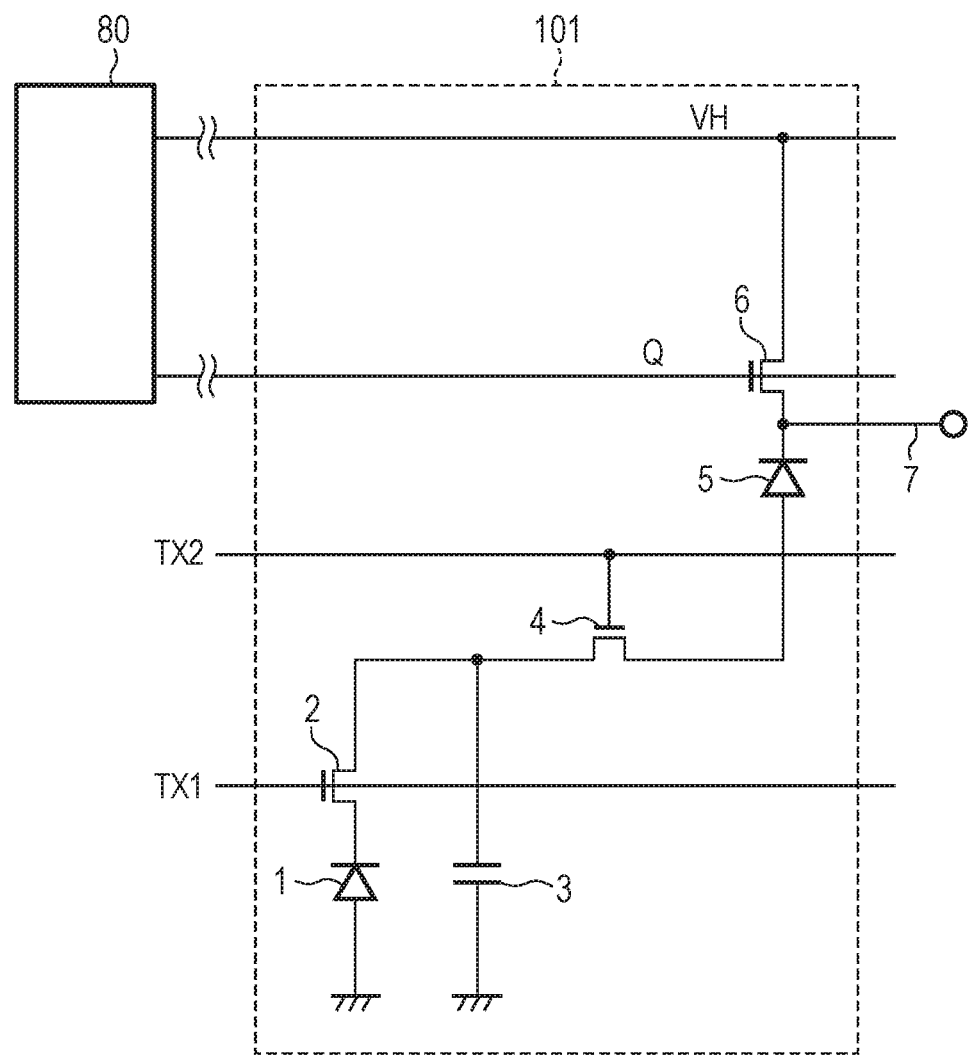
FIG. 2 is an equivalent circuit diagram of a photoelectric conversion element in the first embodiment of the present disclosure.

FIG. 2 is an equivalent circuit diagram of the photoelectric conversion element 101 in the present embodiment. The photoelectric conversion element 101 has a photoelectric conversion unit 1, a first transfer gate 2, a charge accumulation unit 3, a second transfer gate 4, a charge multiplication unit 5, a quench circuit 6, and an output node 7.

The photoelectric conversion unit 1 includes a photodiode and generates and accumulates charge pairs in accordance with an incident light. The first transfer gate 2 forms a MOS transistor, and a control signal TX1 from the vertical select circuit 103 is applied to the first transfer gate 2. In response to the MOS transistor having the first transfer gate 2 being turned on, one or more signal charges in the photoelectric conversion unit 1 are transferred to the charge accumulation unit 3. Note that at least one of a polysilicon or a metal (copper, aluminum, or the like) may be used for the material of the gate.

The charge accumulation unit 3 is formed of an impurity diffusion region formed in the semiconductor substrate or an electrode and accumulates charges transferred from the first transfer gate 2. The second transfer gate 4 forms a MOS transistor, and a control signal TX2 from the vertical select circuit 103 is applied to the second transfer gate 4. In response to the MOS transistor having the second transfer gate 4 being turned on, one or more signal charges are transferred from the charge accumulation unit 3 to the charge multiplication unit 5.

The charge multiplication unit 5 includes an avalanche diode, and avalanche-multiplies supplied charges to generate an avalanche current. A predetermined electric potentials are supplied to the anode and the cathode of the charge multiplication unit 5, respectively. The electric potential supplied to the cathode of the charge multiplication unit 5 is higher than the electric potential supplied to the anode. That is, a reverse bias voltage is applied between the anode and the cathode of the charge multiplication unit 5. In this state, once charges are supplied to the charge multiplication unit 5, an avalanche current occurs by avalanche multiplication.

The quench circuit (detection unit) 6 is formed of a MOS transistor, for example, and is connected to the cathode of the charge multiplication unit 5 and a power source voltage line. The output node 7 is connected to the connection node of the charge multiplication unit 5 and the quench circuit 6 and outputs a voltage signal based on the avalanche current. The quench circuit 6 has a function of replacing a change in an avalanche current in the charge multiplication unit 5 with a voltage signal. Furthermore, the quench circuit 6 functions as a load circuit at the time of avalanche multiplication and has a function of suppressing avalanche multiplication by suppressing the current to be supplied to the charge multiplication unit 5. In a period in which a reverse bias voltage of such a degree that causes electronic avalanche is applied to the charge multiplication unit 5, in response to a single signal charge being transferred to the charge multiplication unit 5, a current is multiplied by avalanche multiplication. The multiplied current causes a voltage drop in the quench circuit 6, and the electric potential of the cathode of the charge multiplication unit 5 decreases. As a result, electronic avalanche is no longer formed in the charge multiplication unit 5, and avalanche multiplication in the charge multiplication unit 5 stops. Since an electric potential VH is then supplied to the cathode of the charge multiplication unit 5 via the quench circuit 6, the electric potential supplied to the cathode of the charge multiplication unit 5 returns to the electric potential VH. That is, the operation region of the charge multiplication unit 5 enters a Geiger mode again. Note that the quench circuit 6 may be formed of a resistor element.

A voltage control unit 80 can control the electric potential VH and a voltage Q in the photoelectric conversion element 101. For example, the voltage control unit 80 can stop an avalanche operation of the charge multiplication unit 5 by reducing the electric potential VH and start an avalanche operation of the charge multiplication unit 5 by increasing the electric potential VH. Further, the voltage control unit 80 may control the voltage Q at the gate of the quench circuit 6. For example, the voltage control unit 80 may detect an increase in the avalanche current in the charge multiplication unit 5 and perform feedback control to change the voltage Q.

Figure 3:
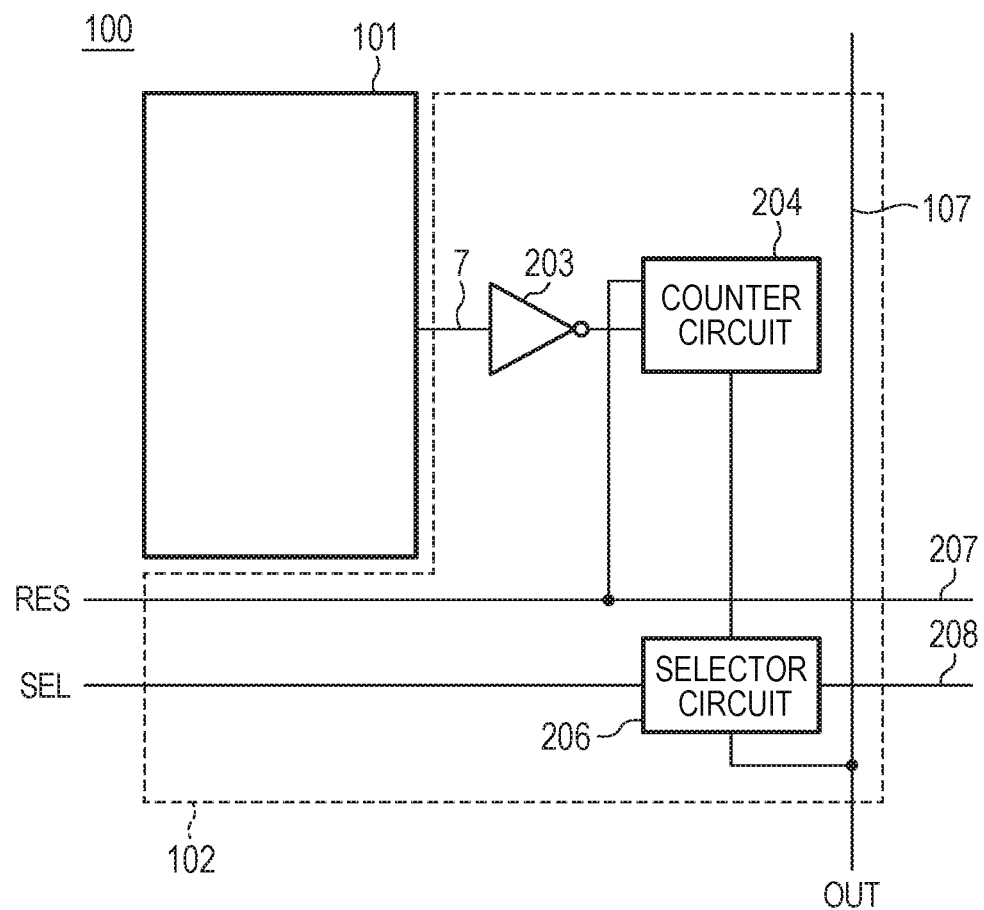
FIG. 3 is a block diagram of a pixel signal processing unit in the first embodiment of the present disclosure.

FIG. 3 is a block diagram of a pixel signal processing unit in the present embodiment. The pixel signal processing unit 102 has an inverter circuit 203, a counter circuit (counter unit) 204, and a selector circuit 206.

The inverter circuit 203 shapes an electric potential change at the output node 7 and outputs a pulse signal. When the electric potential of the cathode of the charge multiplication unit 5 is higher than a threshold of the inverter circuit 203, the output of the inverter circuit 203 is at a low level. On the other hand, when the electric potential of the cathode is lower than a threshold of the inverter circuit 203, the output of the inverter circuit 203 is at a high level. That is, a binarized pulse signal is output from the inverter circuit 203. A pulse signal is output from the inverter circuit 203 in accordance with whether or not there is a signal charge avalanche-multiplied by the charge multiplication unit 5.

The counter circuit 204 is connected to the inverter circuit 203, counts the number of pulses output from the inverter circuit 203, and outputs a cumulative count value. The counter circuit 204 may be an N-bit counter (N is a positive integer), for example. In such a case, the counter circuit 204 can count the number of pulses up to about the N-th power of two at the maximum. The counted number is held in the counter circuit 204 as a detection signal. Further, a control signal RES is supplied to the counter circuit 204 from the vertical select circuit 103 via a drive line 207. Once the control signal RES is supplied to the counter circuit 204, the held counted number is reset. That is, the counter circuit 204 changes the count value in response to receiving a pulse from the inverter circuit 203. In such a way, the counter circuit 204 counts the number of occurrences of an avalanche current that arises in response to at least one signal charge being transferred to the charge multiplication unit 5 and avalanche-multiplied.

The selector circuit 206 switches electrical connection/disconnection between the counter circuit 204 and the signal line 107. A control signal SEL is supplied to the selector circuit 206 from the vertical select circuit 103 via a drive line 208. In response to the control signal SEL being supplied to the selector circuit 206, the electrical connection/disconnection between the counter circuit 204 and the signal line 107 is switched in accordance with the level of the control signal SEL. The selector circuit 206 may include, for example, a transistor, a buffer circuit used for outputting a signal to the outside of the pixel 100, or the like. In response to the counter circuit 204 and the signal line 107 being electrically connected, the count value held in the counter circuit 204 is output to the signal line 107.

Note that, instead of the selector circuit 206, a switch such as a transistor may be provided to the node between the quench circuit 6 and the charge multiplication unit 5 or between the photoelectric conversion element 101 and the pixel signal processing unit 102. Also in such a case, by switching connection/disconnection of the switch, the same function as the selector circuit 206 may be realized. Similarly, supply of the electric potential VH to be supplied to the quench circuit 6 may be electrically switched by using a switch such as a transistor.

When a plurality of counter circuits 204 are arranged, a plurality of signals may be supplied to the selector circuit 206. Thereby, when count values held in the counter circuits 204 are output to the signal line 107, it is possible to control the output to the signal line 107 on a counter circuit 204 basis.

The count value that is a digital signal held in the counter circuit 204 serves as a signal used for forming a captured image. Specifically, in the pixel unit 106 in which the plurality of pixels 100 are arranged in a matrix, a captured image may be acquired by a rolling shutter operation. That is, count values in the counter circuit may be reset sequentially on a row basis, and the count values held in the counter circuit 204 may be output sequentially on a row basis. Further, a captured image may be acquired by a global electronic shutter operation. In the global electronic shutter operation, count values in the counter circuits 204 on all the pixel rows can be reset at the same time, and detected signals held in the counter circuits 204 can be output sequentially on a row basis.

Note that, when the global electronic shutter operation is performed, it is preferable to add a switching unit that switches whether or not to perform counting in the counter circuits 204 in order to cause the time for performing counting of pulses to be the same as respective rows. The unit that switches whether or not to perform counting may be a switch such as a transistor, for example.

Further, instead of the counter circuit 204, a Time to Digital Converter (hereafter, referred to as a TDC) and a memory unit may be provided. In such a case, the photodetection device 1010 can acquire the timing when a pulse is detected.

In this modified example, the occurrence timing of a pulse signal output from the inverter circuit 203 is converted to a digital signal by the TDC. As a reference signal used for measuring the timing of a pulse signal, the control signal RES is supplied to the TDC from the vertical select circuit 103 via a drive line. The TDC references the control signal RES as a reference of time and acquires a digital signal corresponding to the input time of a pulse from the inverter circuit 203.

As a circuit of the TDC, a delay line scheme in which a delay line of buffer circuits connected in series is used to form a delay circuit, a looped TDC scheme in which a circuit of delay lines connected in a loop is used, or the like may be used, for example. While other schemes may be used for the circuit of the TDC, a scheme that can achieve time resolution that is greater than or equal to the time resolution of the photoelectric conversion element 101 is preferable in order to ensure sufficient time resolution.

A digital signal acquired by the TDC is held in one or a plurality of memories. When the number of memories is plural, it is possible to cause any one of the plurality of memories to selectively output a signal to the signal line 107 by supplying a plurality of control signals SEL to the selector circuit 206.

Figure 4:
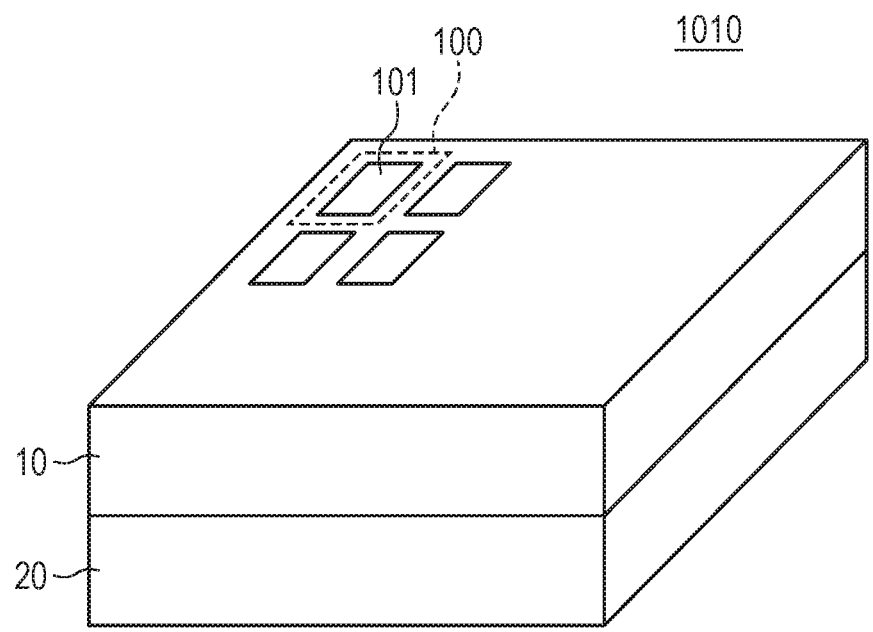
FIG. 4 is a schematic diagram of a photo-detection device in the first embodiment of the present disclosure.

FIG. 4 is a schematic diagram of the photo-detection device in the present embodiment. The photo-detection device 1010 is formed with a plurality of substrates being stacked. For example, the photo-detection device 1010 includes a substrate (first semiconductor substrate) 10 in which a plurality of photoelectric conversion elements 101 are formed and a substrate (second semiconductor substrate) 20 in which a plurality of pixel signal processing units 102 are formed. The substrate 10 and the substrate 20 are attached at a junction interface. The junction interface is formed of a metal such as copper and an insulating member such as an oxide film. The metal forming the junction interface may form a wiring connecting an element arranged on the substrate 10, such as the photoelectric conversion element 101, to a circuit arranged on the substrate 20, such as a counter.

Optical members such as color filters, micro-lenses, or the like are arranged on a first primary face, that is, a light incidence face of the substrate 10, and circuit elements forming the photoelectric conversion element 101 are formed on a second primary face of the substrate 10. The substrate 20 is stacked on the second primary face of the substrate 10. A circuit group forming one pixel 100 is divided and formed in the substrate 10 and the substrate 20. Thereby, it is possible to prevent an increase in the area of the photo-detection device in a plan view while realizing an increase in the speed or an increase in the size of a digital circuit including the counter circuit. Note that the photoelectric conversion element 101 and the pixel signal processing unit 102 may be arranged side-by-side on a single substrate.

Figure 5:
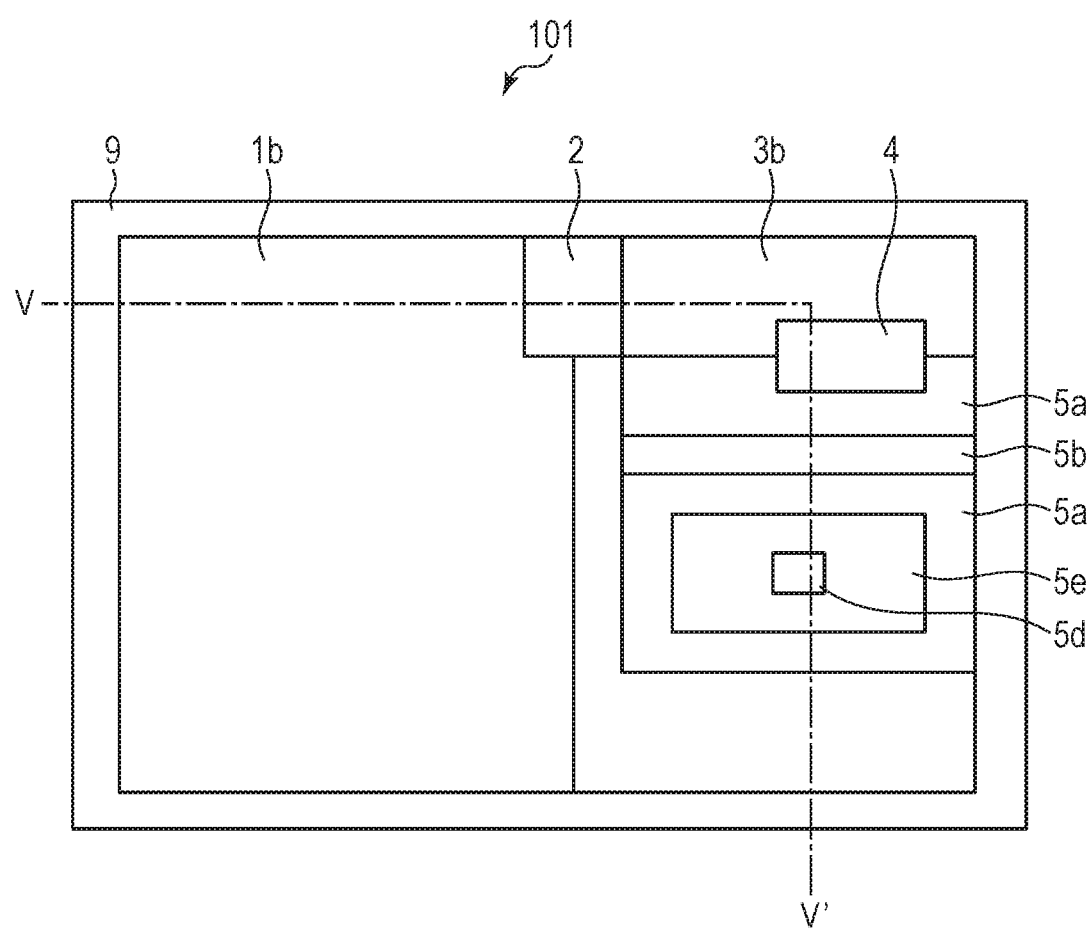
FIG. 5 is a plan view in a first primary face of the photoelectric conversion element in the first embodiment of the present disclosure.
Figure 6:
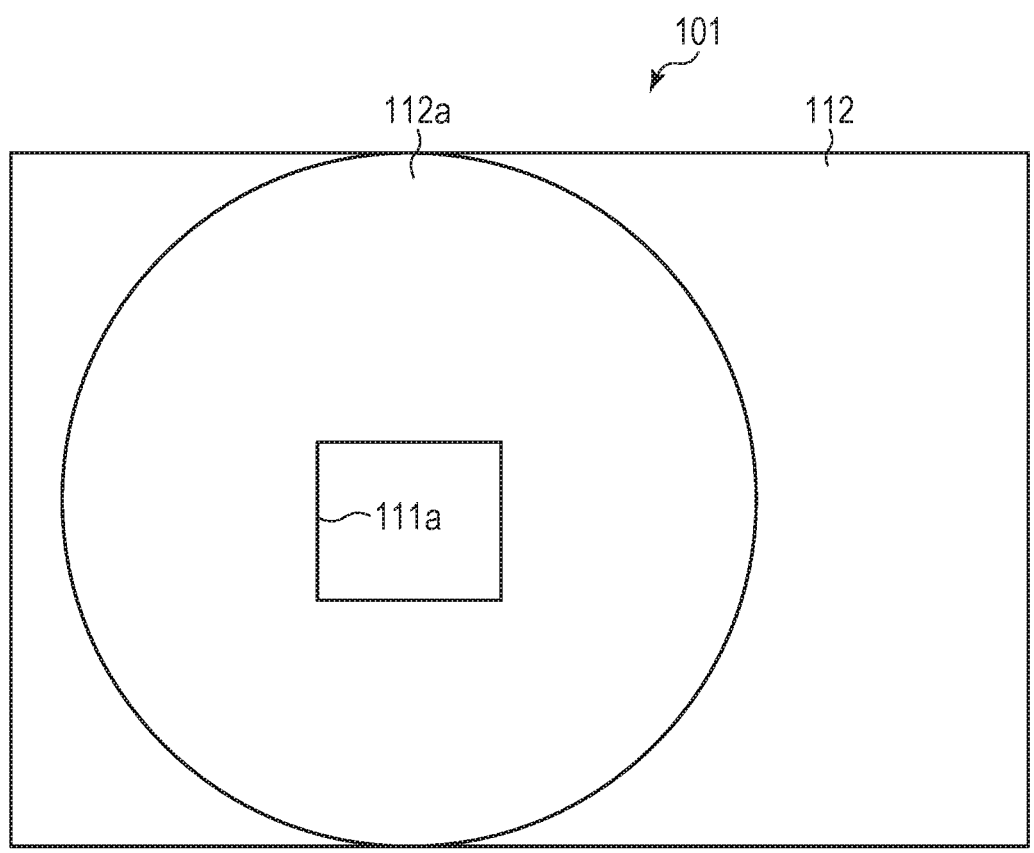
FIG. 6 is a plan view in a second primary face of the photoelectric conversion element in the first embodiment of the present disclosure.
Figure 7:
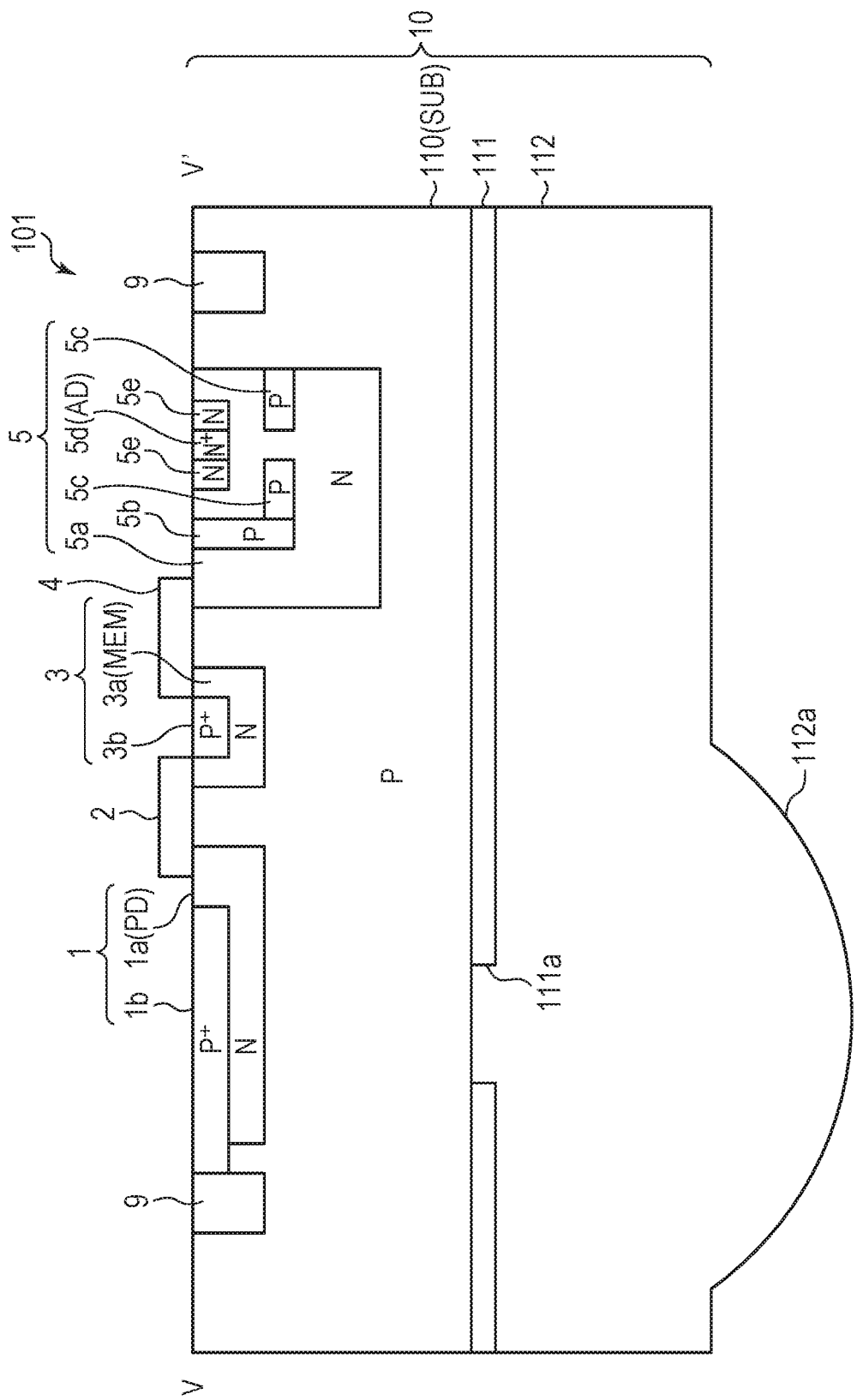
FIG. 7 is a sectional view of the photoelectric conversion element in the first embodiment of the present disclosure.

With reference to FIG. 5, FIG. 6, and FIG. 7, the configuration of the photoelectric conversion element 101 in the present embodiment will be described in detail. FIG. 5 is a plan view of the second primary face of the photoelectric conversion element 101, and FIG. 6 is a plan view of the first primary face of the photoelectric conversion element 101. Further, FIG. 7 is a sectional view taken along a break line V-V of the photoelectric conversion element 101 in FIG. 5.

In the following description, an electron is used as a signal charge. A semiconductor region of a first conductive type in which first polarity carriers are the majority carriers is an N-type semiconductor region, and a semiconductor region of a second conductive type in which second polarity carriers are the majority carriers is a P-type semiconductor region. Note that a hole may be used as a signal charge, and in such a case, the N-type and the P-type will be opposite.

The photoelectric conversion element 101 is formed in the substrate 10, and the substrate 10 includes a P-type semiconductor substrate 110, a light-shielding member 111, and an optical member 112. In the semiconductor substrate 110, a rectangular pixel isolation region 9 is formed in a plan view in the semiconductor substrate 110. In the region surrounded by the pixel isolation region 9, an N-type semiconductor region (first semiconductor region) 1a, an N-type semiconductor region (second semiconductor region) 3a, an N-type semiconductor region (third semiconductor region) 5a, the first transfer gate (first gate) 2, and the second transfer gate (second gate) 4 are formed. The pixel isolation region 9 is used for isolating the adjacent photoelectric conversion elements 101 from each other.

The N-type semiconductor region 1a (PD) forms the photoelectric conversion unit 1 together with the P-type semiconductor substrate 110 and accumulates charges generated by photoelectric conversion. Further, in a plan view, a P-type semiconductor region 1b is formed in a region which is on the N-type semiconductor region 1a and does not overlap the first transfer gate 2. The P-type semiconductor region 1b reduces unnecessary charges that may occur at the surface of the semiconductor substrate 110. In particular, by increasing the impurity concentration of the P-type semiconductor region 1b, it is possible to prevent depletion at the semiconductor interface, and it is possible to avoid occurrence of unnecessary charges and reduce the occurrence speed of a dark current.

The first transfer gate 2 is formed so as to overlap a part of each of the N-type semiconductor regions 1a and 3a in a plan view. The first transfer gate 2 controls the height of a potential barrier near the semiconductor interface directly under the first transfer gate 2. By controlling the voltage applied to the first transfer gate 2, one or more signal charges are transferred from the N-type semiconductor region 1a to the N-type semiconductor region 3a.

The N-type semiconductor region 3a (MEM) forms the charge accumulation unit 3 together with the P-type semiconductor substrate 110 and restricts the amount of charges transferred from the N-type semiconductor region 1a to the N-type semiconductor region 5a. It is preferable that the N-type semiconductor region 3a be smaller than the N-type semiconductor region 1a in a plan view and the number of charges that can be accumulated in the N-type semiconductor region 3a (saturation charge amount) be less than the number of charges that can be accumulated in the N-type semiconductor region 1a (saturation charge amount). A P-type semiconductor region 3b is formed in a region which is on the N-type semiconductor region 3a and does not overlap the first transfer gate 2 and the second transfer gate 4. In the same manner as the P-type semiconductor region 1b described above, the P-type semiconductor region 3b reduces unnecessary charges that may occur on the surface of the semiconductor substrate 110.

The second transfer gate 4 is formed so as to overlap a part of each of the N-type semiconductor regions 3a and 5a in a plan view. The second transfer gate 4 controls the height of a potential barrier near the semiconductor interface directly under the second transfer gate 4. By controlling the voltage applied to the second transfer gate 4, one or more signal charges are transferred from the N-type semiconductor region 3a to the N-type semiconductor region 5a.

P-type semiconductor regions 5b and 5c and N-type semiconductor regions 5d and 5e are formed inside the N-type semiconductor region 5a. The P-type semiconductor region 5c forms the anode of an avalanche diode, and the N-type semiconductor region 5d forms the cathode of the avalanche diode. The N-type semiconductor region 5a and the P-type semiconductor region 5b guide a signal charge to the avalanche diode. An electric field between the P-type semiconductor region 5c and the N-type semiconductor region 5d causes charge multiplication due to avalanche multiplication. The N-type semiconductor region 5e mitigates the electric field of the avalanche diode. Although not illustrated in FIG. 7, a quench circuit is further formed in the semiconductor substrate 110, and the quench circuit may be electrically connected to the N-type semiconductor region 5d of the avalanche diode.

The light-shielding member 111 is provided on the first primary face of the photoelectric conversion element 101 and has an opening 111a at a position corresponding to the photoelectric conversion unit 1 in a plan view. The optical member 112 is formed of a transmissive material and may include a micro-lens 112a, a color filter, or the like. The micro-lens 112a collects an incident light from the backside of the substrate 10 and guides the collected light to the photoelectric conversion unit 1 via the opening 111a. The region other than the photoelectric conversion unit 1 is shielded form light by the light-shielding member 111, and no light enters the charge accumulation unit 3 and the charge multiplication unit 5.

Figure 8:
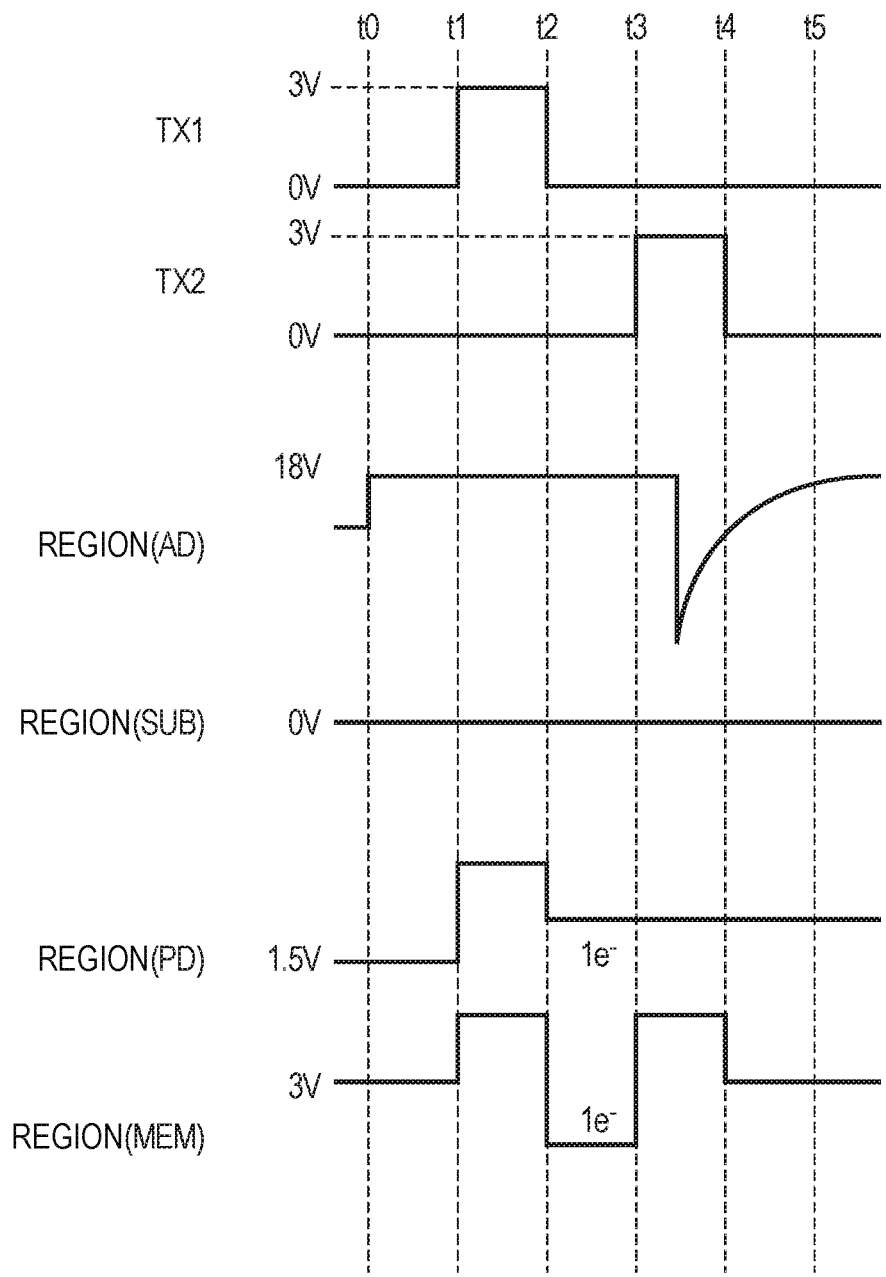
FIG. 8 is a timing chart illustrating an operation of the photo-detection device in the first embodiment of the present disclosure.

FIG. 8 is a timing chart illustrating the operation of the photo-detection device in the present embodiment and illustrates the electric potential of each of the first transfer gate 2 (TX1), the second transfer gate 4 (TX2), the N-type semiconductor region 5d of the charge multiplication unit 5 (AD), the semiconductor substrate 110 (SUB), the N-type semiconductor region 1a of the photoelectric conversion unit 1 (PD), and the N-type semiconductor region 3a of the charge accumulation unit 3 (MEM). The horizontal axis represents time, and as one example, the cycle of readout and detection of signal charges (time t0 to t5) may be several nanoseconds.

On and before time t0, the N-type semiconductor region 1a (PD) accumulates charges based on an incident light. The voltage control unit 80 reduces the electric potential VH and thereby reduces the electric potential of the N-type semiconductor region 5d (AD) to stop the avalanche operation of the charge multiplication unit 5. At this time, each electric potential of the control signals TX1 and TX2 and the semiconductor substrate 110 (SUB) may be 0 V, for example. Further, the electric potentials of the N-type semiconductor region 1a (PD) and the N-type semiconductor region 3a (MEM) may be 1.5 V and 3 V, respectively.

At time t0, the voltage control unit 80 controls the electric potential VH to set the electric potential of the N-type semiconductor region 5d (AD) to 18 V, for example. Thereby, the charge multiplication unit 5 is ready for performing avalanche operation.

In the period of time t1 to t2, the control signal TX1 is controlled to the high level (for example, 3V), and the first transfer gate 2 is turned on. Thereby, some of signal charges accumulated in the N-type semiconductor region 1a (PD) are transferred to the N-type semiconductor region 3a (MEM). Further, in response to an increase in the electric potential of the first transfer gate 2, the electric potentials of the N-type semiconductor region 1a (PD) and the N-type semiconductor region 3a (MEM) also increase.

At time t2, the control signal TX1 is controlled from the high level to the low level, and the first transfer gate 2 is turned off. Several signal charges are accumulated in the N-type semiconductor region 3a (MEM). Here, the number of signal charges may not be correctly counted if a plurality of signal charges are transferred to the charge multiplication unit 5 and avalanche-multiplied at the same time. Thus, the number of signal charges accumulated in the N-type semiconductor region 3a (MEM) is preferably small, and more preferably 1 electron (1 e⁻) or 0 electron (0 e⁻), that is, less than two.

When one electron is transferred from the N-type semiconductor region 1a (PD) to the N-type semiconductor region 3a (MEM), the electric potential of the N-type semiconductor region 1a (PD) increases by an electric potential corresponding to 1 electron (1 e⁻), and the electric potential of the N-type semiconductor region 3a (MEM) decreases by an electric potential corresponding to 1 electron (1 e⁻).

In the period of time t3 to t4, the control signal TX2 is controlled from the low level to the high level, and the second transfer gate 4 is turned on. When a signal charge is transferred from the N-type semiconductor region 3a (MEM) to the N-type semiconductor region 5a, the signal charge is accelerated when passing through an intense electric filed portion between the P-type semiconductor region 5c and the N-type semiconductor region 5d and avalanche-multiplied. An avalanche current flows between the N-type semiconductor region 5d and the P-type semiconductor region 5c, and the electric potential of the N-type semiconductor region 5d decreases. Then, due to the effect of the quench circuit 6, the electric potential of the N-type semiconductor region 5d returns to the electric potential obtained before the avalanche multiplication has occurred. The counter circuit 204 of the pixel signal processing unit 102 counts a change in the electric potential occurring in the N-type semiconductor region 5d as a pulse.

As described above, the number of signal charges accumulated in the N-type semiconductor region 3a (MEM) of the charge accumulation unit 3 is less than the number of signal charges accumulated in the N-type semiconductor region 1a (PD) of the photoelectric conversion unit 1. It is desirable that the number of signal charges accumulated in the N-type semiconductor region 3a (MEM) be one or zero. Thereby, a plurality of signal charges are avalanche-multiplied at the same time, and missing of counting of a signal charge can be avoided. While the number of signal charges accumulated in the N-type semiconductor region 3a (MEM) may be zero when the second transfer gate 4 is turned on, the number of signal charges can be counted as long as the signal charge is transferred in one time of transfer out of multiple times of transfer. With the transfer being repeated for multiple times, the time required for counting signal charges may be longer. However, the transfer period of signal charges (time t1 to t2, t3 to t4) is shorter than the accumulation period of charges in the N-type semiconductor region 1a (PD) (on and before time t0). Further, by performing turning on and off of the first transfer gate 2 and the second transfer gate 4 at a high speed, it is possible to avoid the overall processing time being longer.

In the present embodiment, by separately performing accumulation of signal charges in the photoelectric conversion unit 1 and counting of signal charges in the charge multiplication unit 5, it is possible to realize photo-detection at high sensitivity while reducing noise due to unnecessary charges in the charge multiplication unit 5. Further, the number of signal charges accumulated in the charge accumulation unit 3 is less than the number of signal charges accumulated in the photoelectric conversion unit 1. Thus, the number of signal charges avalanche-multiplied at the same time in the charge multiplication unit 5 can be reduced, and the number of signal charges can be counted more accurately. Furthermore, the number of signal charges accumulated in the charge accumulation unit 3 is one or zero, that is, less than two, and thereby the number of signal charges can be counted much more accurately.

Further, signal charges accumulated in the photoelectric conversion unit 1 are transferred to the charge multiplication unit 5 via the charge accumulation unit 3. It is therefore possible to transfer signal charges from the charge accumulation unit 3 to the charge multiplication unit 5 while performing accumulation of signal charges by using long time exposure in the photoelectric conversion unit 1.

Second Embodiment

Figure 9:
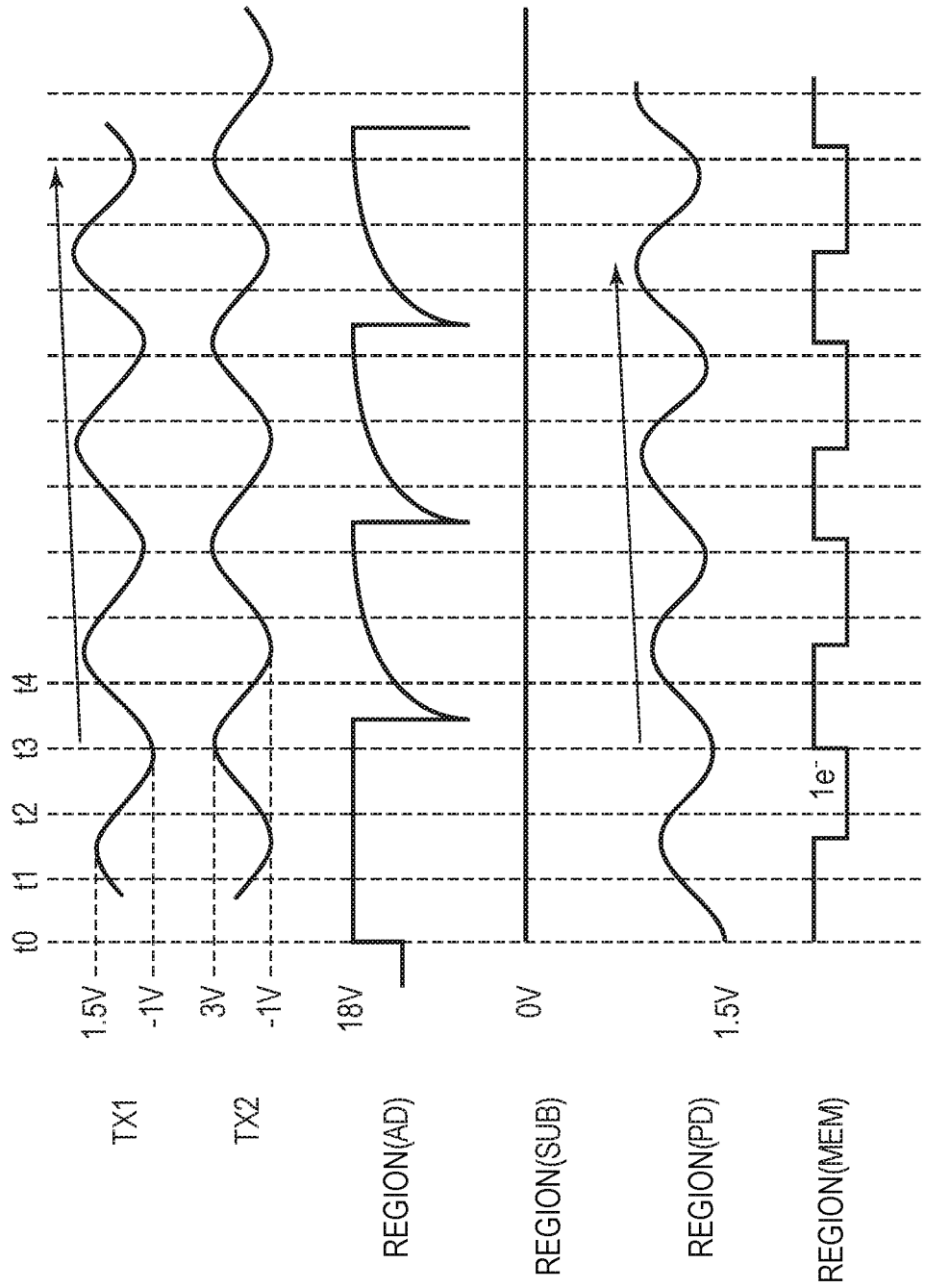
FIG. 9 is a timing chart illustrating an operation of a photo-detection device in a second embodiment of the present disclosure.

FIG. 9 is a timing chart illustrating the operation of a photo-detection device in the present embodiment and illustrates the electric potential of each of the first transfer gate 2 (TX1), the second transfer gate 4 (TX2), the N-type semiconductor region 5d of the charge multiplication unit 5 (AD), the semiconductor substrate 110 (SUB), the N-type semiconductor region 1a of the photoelectric conversion unit 1 (PD), and the N-type semiconductor region 3a of the charge accumulation unit 3 (MEM). The present embodiment will be described mainly for features which are different from those of the first embodiment.

In the present embodiment, the pulse width of each of the control signals TX1 and TX2 may be around 1 nanosecond, for example. In particular, by reducing the pulse width of the control signal TX2 of the second transfer gate 4, it is possible to reduce the period of an avalanche operation in the charge multiplication unit 5, and it is possible to reduce noise due to avalanche multiplication of unnecessary charges. For example, it is assumed that the number of signal charges accumulated in the photoelectric conversion unit 1 corresponds to 10,000 electrons, and the time required for one cycle of the operation from signal charge transfer in the photoelectric conversion unit 1 to avalanche multiplication in the charge multiplication unit 5 is 5 nanoseconds. In this case, the time required for readout of signal charges accumulated in the photoelectric conversion unit 1 will be only 10,000×5 nanoseconds=50 µseconds, which is sufficiently shorter than several 10 milliseconds of accumulation time. Therefore, when the pulse width of the first transfer gate 2 and the second transfer gate 4 is reduced, the time required for readout is not so longer even when the number of times of readout is increased.

When the control signals TX1 and TX2 are driven at a high speed, the rising edge and the falling edge of the waveform are no longer steep, the electric potentials of the control signals TX1 and TX2 change in accordance with a sinewave. Even when the control signals TX1 and TX2 are sinewaves, it is possible to drive the first transfer gate 2 and the second transfer gate 4. In the timing chart illustrated in FIG. 9, the control signals TX1 and TX2 are sinewaves, and the control signal TX2 is driven with a delay of around ½ cycle from the control signal TX1. The control signal TX1 changes between −1 V and 1.5 V, for example, in the initial state, and the peak electric potential increases at every repetition of charge transfer. The control signal TX2 repeatedly changes between −1 V to 3 V, for example.

On and before time t0, the N-type semiconductor region 1a of the photoelectric conversion unit 1 (PD) accumulates charges based on an incident light. The voltage control unit 80 reduces the electric potential VH and thereby reduces the electric potential of the N-type semiconductor region 5d of the charge multiplication unit 5 to stop the avalanche multiplication in the charge multiplication unit 5. At this time, the electric potential of the N-type semiconductor region 1a (PD) may be 1.5 V.

At time t0, the voltage control unit 80 controls the electric potential VH to set the electric potential of the N-type semiconductor region 5d (AD) to 18 V, for example. Thereby, the charge multiplication unit 5 is in a state where avalanche multiplication can be performed.

In the period of time t1 to t2, once the level of the control signal TX1 exceeds a threshold, the first transfer gate 2 is turned on. Thereby, some of signal charges accumulated in the N-type semiconductor region 1a (PD) are transferred to the N-type semiconductor region 3a (MEM). In response to an increase in the electric potential of the first transfer gate 2, the electric potential of the N-type semiconductor region 1a (PD) also increases. The electric potential of the N-type semiconductor region 3a (MEM) also increases. The control signal TX2 changes in a phase opposite to the control signal TX1. Thus, the control signals TX1 and TX2 are cancelled with each other in the N-type semiconductor region 3a (MEM), and the electric potential in the N-type semiconductor region 3a (MEM) will be small.

When the level of the control signal TX1 becomes lower than the threshold, the first transfer gate 2 is turned off. A signal charge of 1 electron (1 e⁻) or 0 electron (0 e⁻) is accumulated in the N-type semiconductor region 3a (MEM). When one electron is transferred from the N-type semiconductor region 1a (PD) to the N-type semiconductor region 3a (MEM), the electric potential of the N-type semiconductor region 1a (PD) increases by an electric potential corresponding to 1 electron (1 e⁻), and the electric potential of the N-type semiconductor region 3a (MEM) decreases by an electric potential corresponding to 1 electron (1 e⁻).

At time t3, in response to the level of the control signal TX2 exceeding a threshold, and the second transfer gate 4 is turned on. When a signal charge is transferred from the N-type semiconductor region 3a (MEM) to the N-type semiconductor region 5a, the electric potential of the N-type semiconductor region 3a (MEM) increases by an electric potential corresponding to 1 electron (1 e⁻). The signal charge transferred to the N-type semiconductor region 5a is accelerated when passing through an intense electric filed portion between the P-type semiconductor region 5c and the N-type semiconductor region 5d and avalanche-multiplied. An avalanche current flows between the N-type semiconductor region 5d (AD) and the P-type semiconductor region 5c, and the electric potential of the N-type semiconductor region 5d decreases. Then, due to the effect of the quench circuit 6, the electric potential of the N-type semiconductor region 5d (AD) returns to the electric potential obtained before the avalanche multiplication has occurred. The counter circuit 204 of the pixel signal processing unit 102 counts a change in the electric potential occurring in the N-type semiconductor region 5d (AD) as a pulse.

Subsequently, in the same manner, the first transfer gate 2 and the second transfer gate 4 are sequentially turned on. Signal charges are sequentially transferred from the photoelectric conversion unit 1 to the charge multiplication unit 5 via the charge accumulation unit 3, and avalanche multiplication is performed thereon in the charge multiplication unit 5. The first transfer gate 2 is turned on, and the peak value of the electric potential in the N-type semiconductor region 1a (PD) gradually increases every time signal charges are transferred from the N-type semiconductor region 1a (PD).

When the number of signal charges accumulated in the N-type semiconductor region 1a (PD) is large, the electric potential of the N-type semiconductor region 1a (PD) decreases. Thus, even when the electric potential of the first transfer gate 2 is not so high, signal charges are easily transferred from the N-type semiconductor region 1a (PD). Here, the electric potential of the first transfer gate 2 is set to be low to suppress signal charge transfer, and thereby current consumption can be reduced. On the other hand, when the number of signal charges accumulated in the N-type semiconductor region 1a (PD) is small, the electric potential of the N-type semiconductor region 1a (PD) becomes high. In such a case, to transfer signal charges from the N-type semiconductor region 1a (PD) to the N-type semiconductor region 3a (MEM), it is preferable to set the peak value of the electric potential of the first transfer gate 2 to be high. In the present embodiment, by gradually increasing the peak value of the electric potential of the control signal TX1 applied to the first transfer gate 2 from a low value to a high value, it is possible to perform stable charge transfer while reducing current consumption. For example, in the initial signal transfer after the photoelectric conversion unit 1 accumulates signal charges, the peak electric potential of the control signal TX1 may be set to a sufficiently low value, for example, 1.5 V. The peak electric potential of the control signal TX1 then increases as time elapses and may be increased to 3 V, for example. Note that the peak value of the electric potential of the control signal TX1 may be increased in the same manner by increasing the offset electric potential of the sinewave with time. Further, the peak value of the electric potential may be changed by changing the amplitude of the control signal TX1.

The number of signal charges accumulated in the N-type semiconductor region 3a (MEM) of the charge accumulation unit 3 is less than the number of signal charges in the N-type semiconductor region 1a (PD) of the photoelectric conversion unit 1 and may preferably be one or zero. Further, in the N-type semiconductor region 3a (MEM), the electric potentials of the control signals TX1 and TX2 are cancelled with each other. Thus, the electric potential of the N-type semiconductor region 3a (MEM) only increases by an electric potential corresponding to 1 electron. It is therefore possible to transfer the signal charge from the N-type semiconductor region 3a (MEM) to the N-type semiconductor region 5a without changing the peak electric potential of the control signal TX2 in the second transfer gate 4.

As described above, according to the present embodiment, together with the effect and advantage in the first embodiment, it is possible to reduce the time required for counting signal charges by reducing the cycle of transfer and avalanche multiplication of signal charges to several nanoseconds. Thus, noise can be reduced.

Third Embodiment

Figure 10:
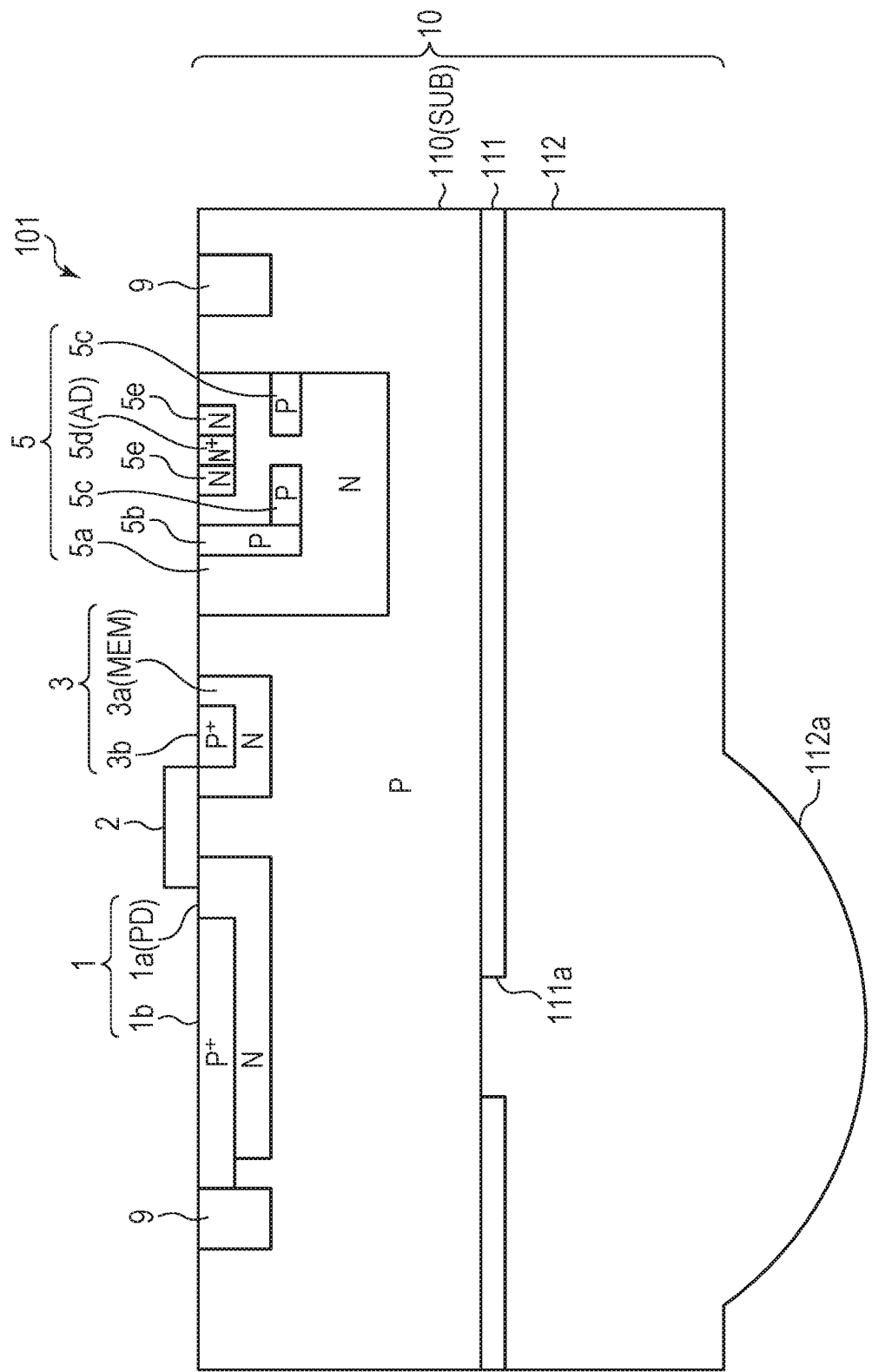
FIG. 10 is a sectional view of a photoelectric conversion element in a third embodiment of the present disclosure.

Next, a photo-detection device in a third embodiment will be described. FIG. 10 is a sectional view of photoelectric conversion elements in the present embodiment. In the photoelectric conversion element in the present embodiment, no second transfer gate is formed between the N-type semiconductor region 3a of the charge accumulation unit 3 and the N-type semiconductor region 5a of the charge multiplication unit 5. Signal charge transfer from the charge accumulation unit 3 to the charge multiplication unit 5 is performed by reducing the electric potential when the first transfer gate 2 is in an off-state to be lower than the electric potential in the first and second embodiments. Other features are the same as those of the photoelectric conversion element illustrated in FIG. 7.

Figure 11:
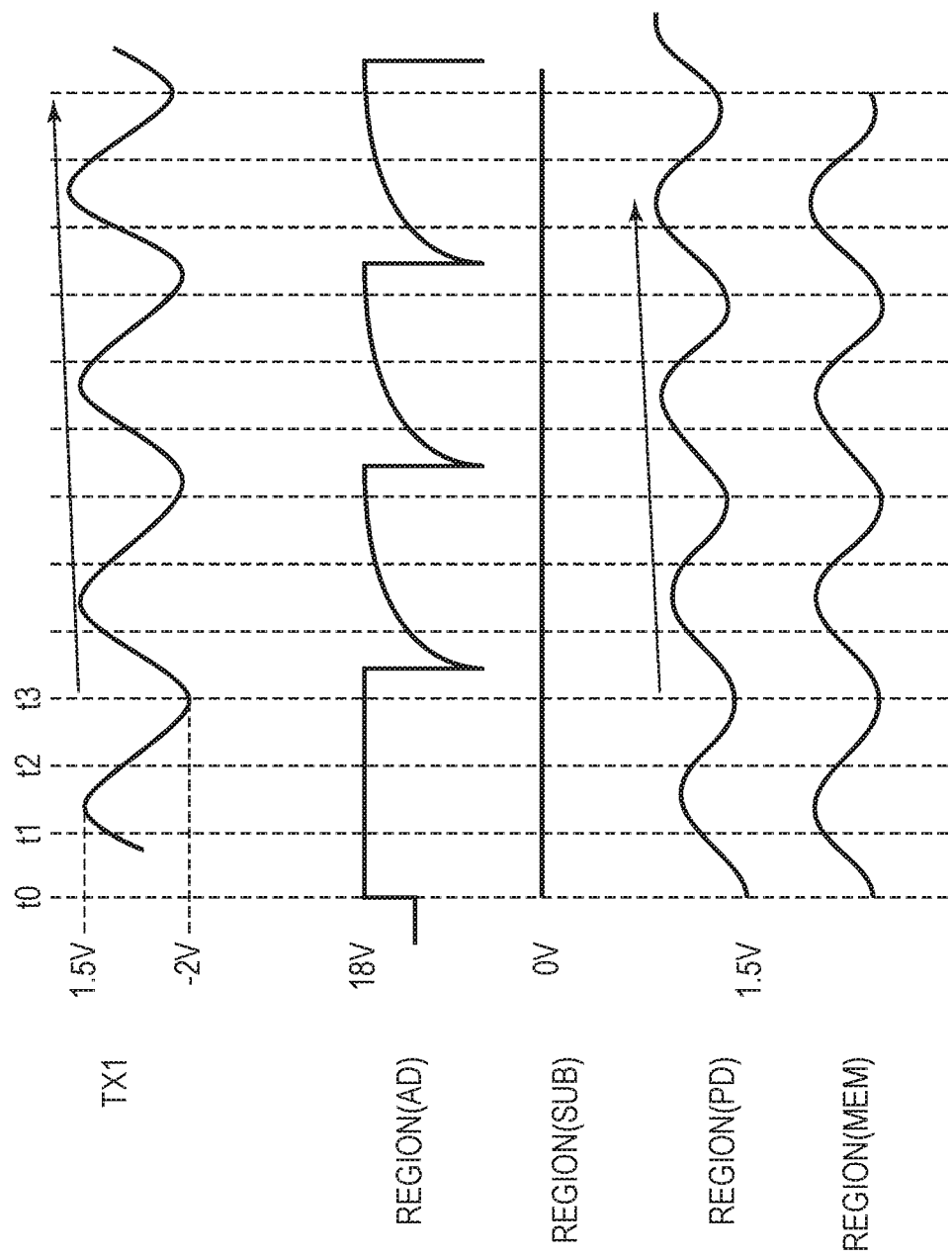
FIG. 11 is a timing chart illustrating an operation of a photo-detection device in the third embodiment of the present disclosure.

FIG. 11 is a timing chart illustrating the operation of the photo-detection device in the present embodiment and illustrates the electric potential of each of the first transfer gate 2 (TX1), the N-type semiconductor region 5d of the charge multiplication unit 5 (AD), the semiconductor substrate 110 (SUB), the N-type semiconductor region 1a of the photoelectric conversion unit 1 (PD), and the N-type semiconductor region 3a of the charge accumulation unit 3 (MEM). In the same manner as the second embodiment, the pulse width of the control signal TX1 applied to the first transfer gate 2 may be 1 nanosecond, for example. Further, the time required for one cycle of the operation from signal charge transfer in the photoelectric conversion unit 1 to avalanche multiplication in the charge multiplication unit 5 is 5 nanoseconds, for example. Features different from those in the timing chart (FIG. 9) in the second embodiment will be mainly described below.

On and before time t0, the N-type semiconductor region 1a (PD) accumulates charges based on an incident light, and the charge multiplication unit 5 suspends the avalanche operation. At time t0, the charge multiplication unit 5 is ready for performing avalanche operation. In the period of time t1 to t2, once the level of the control signal TX1 exceeds a threshold, the first transfer gate 2 is turned on. Thereby, some of signal charges accumulated in the N-type semiconductor region 1a (PD) are transferred to the N-type semiconductor region 3a (MEM). Further, in response to an increase in the electric potential of the first transfer gate 2, the electric potentials of the N-type semiconductor region 1a (PD) and the N-type semiconductor region 3a (MEM) also increase.

In the period of time t2 to t3, in response to a decrease in the electric potential of the control signal TX1, the electric potential of the N-type semiconductor region 3a (MEM) also decreases. When the electric potential of the N-type semiconductor region (MEM) becomes sufficiently lower than the electric potential of the semiconductor substrate 110 (SUB), signal charges start moving from the N-type semiconductor region 3a (MEM) to the N-type semiconductor region 5a. In the present embodiment, the electric potential of the low level of the control signal TX1 may be −2 V, for example. The signal charges transferred to the N-type semiconductor region 5a are avalanche-multiplied in the charge multiplication unit 5. Then, when the electric potential of the control signal TX1 increases, and the difference between the electric potentials of the N-type semiconductor region 3a (MEM) and the semiconductor substrate 110 (SUB) becomes below the threshold, signal charge transfer from the N-type semiconductor region 3a (MEM) to the N-type semiconductor region 5a is no longer performed.

Subsequently, in the same manner, the control signal TX1 is driven with a sinewave at a constant cycle, and signal charges from the N-type semiconductor region 1a (PD) are transferred to the N-type semiconductor region 5a via the N-type semiconductor region 3a (MEM). As the number of signal charges of the N-type semiconductor region 1a (PD) decreases, the electric potential of the N-type semiconductor region 1a (PD) increases. The vertical select circuit 103 can stably transfer signal charges while reducing current consumption by gradually increasing the peak value of the electric potential of the control signal TX1.

According to the present embodiment, since it is not necessary to provide the second transfer gate between the N-type semiconductor region 3a (MEM) and the N-type semiconductor region 5a, it is possible to reduce the size of a pixel. Note that the control signal TX1 applied to the first transfer gate 2 is not limited to a sinewave but may be a square wave in the same manner as in the first embodiment.

Fourth Embodiment

Figure 12:
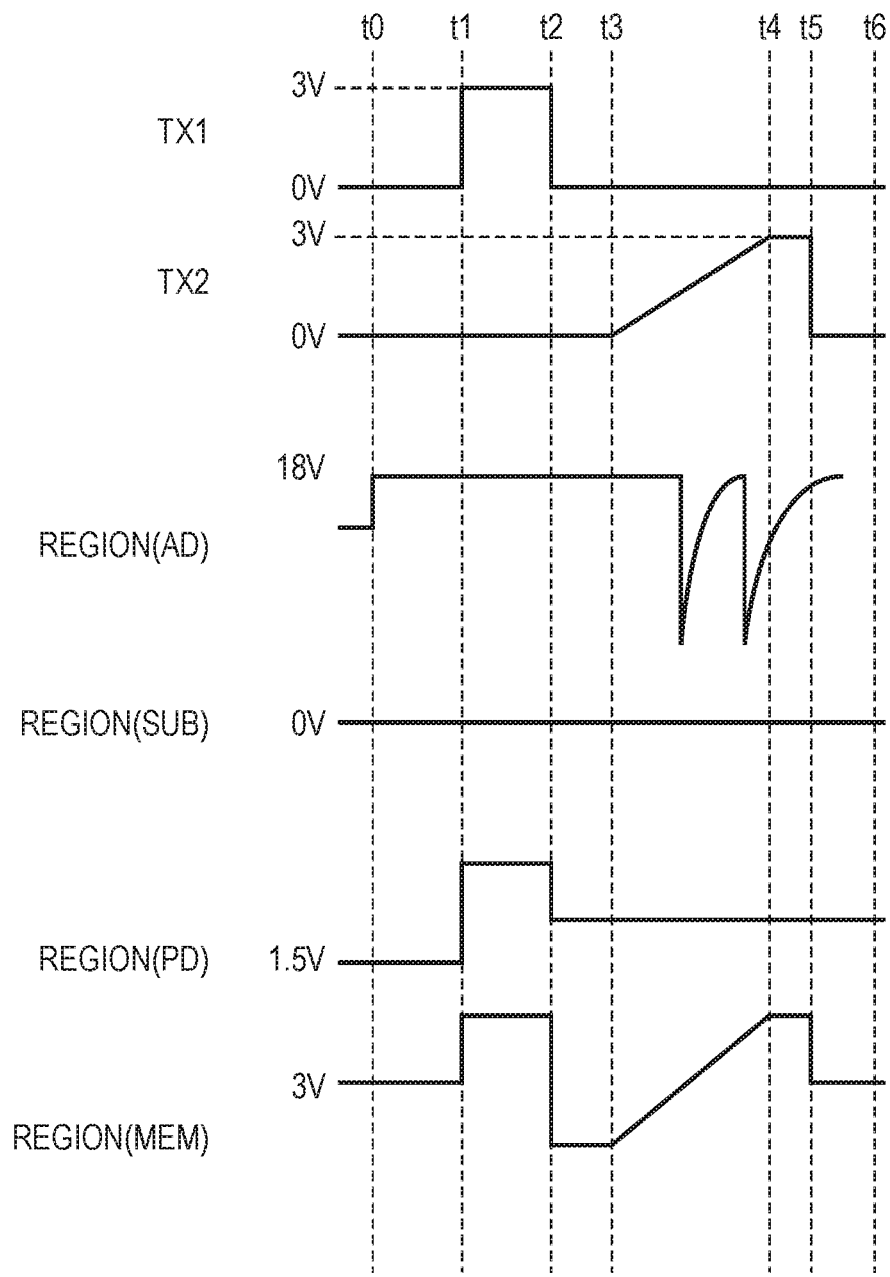
FIG. 12 is a timing chart illustrating an operation of a photo-detection device in a fourth embodiment of the present disclosure.

FIG. 12 is a timing chart illustrating the operation of a photo-detection device in the present embodiment. In the present embodiment, the control signal TX2 changes from the low level to the high level in a predetermined transfer period. The photo-detection device in the present embodiment will be described below mainly for features which are different from those of the first embodiment.

The operation from time t0 to t3 is substantially the same as the operation illustrated in FIG. 8 in the first embodiment. In the present embodiment, to avoid missing of counting of a signal charge in the charge multiplication unit 5, the time interval of signal charge transfer to the N-type semiconductor region 5a is set to be longer than time period of an electric potential change in the charge multiplication unit 5. For example, in the period of time t3 to t4, the vertical select circuit 103 gradually increases the electric potential of the control signal TX2 from the low level to the high level. A transfer period for controlling the control signal TX2 from the low level to the high level can be appropriately set and, preferably, be longer than at least a period for controlling the control signal TX2 from the high level to the low level. Even when a plurality of signal charges are accumulated in the N-type semiconductor region 3a (MEM), signal charges are transferred to the N-type semiconductor region 5a one by one, and each of which is avalanche-multiplied. It is therefore possible to avoid missing of counting a signal charge due to simultaneous avalanche multiplication of a plurality of signal charges and correctly count the number of signal charges.

As described above, according to the present embodiment, the second transfer gate 4 transitions from the low level to the high level in a transfer period of a predetermined length. It is therefore possible to avoid a plurality of signal charges being simultaneously transferred to the charge multiplication unit 5 and count the number of signal charges correctly.

Fifth Embodiment

Next, a photo-detection device in the present embodiment will be described mainly for features which are different from those in the third embodiment.

In FIG. 11, as described above, the control signal TX1 is controlled to a lower potential than the semiconductor substrate 110 (SUB), and thereby a signal charge is transferred from the N-type semiconductor region 3a (MEM) to the N-type semiconductor region 5a. Here, when a plurality of signal charges are accumulated in the N-type semiconductor region 3a (MEM), if the plurality of signal charges are simultaneously transferred to the N-type semiconductor region 5a and avalanche-multiplied, missing of counting of a signal charge may occur. The photo-detection device in the present embodiment transfers signal charges one by one from the N-type semiconductor region 3a (MEM) to the N-type semiconductor region 5a by setting a longer time period of transition of the control signal TX1 from the high level to the low level. With such a configuration, it is possible to avoid missing of counting of a signal charge and count the number of signal charges correctly.

Note that the time period of transition of the control signal TX1 from the high level to the low level can be suitably set within a range that does not cause missing of counting of a signal charge. For example, the time period of transition of the control signal TX1 from the high level to the low level may be set to be longer than the time period of transition of the control signal TX1 from the low level to the high level.

Sixth Embodiment

Figure 13:
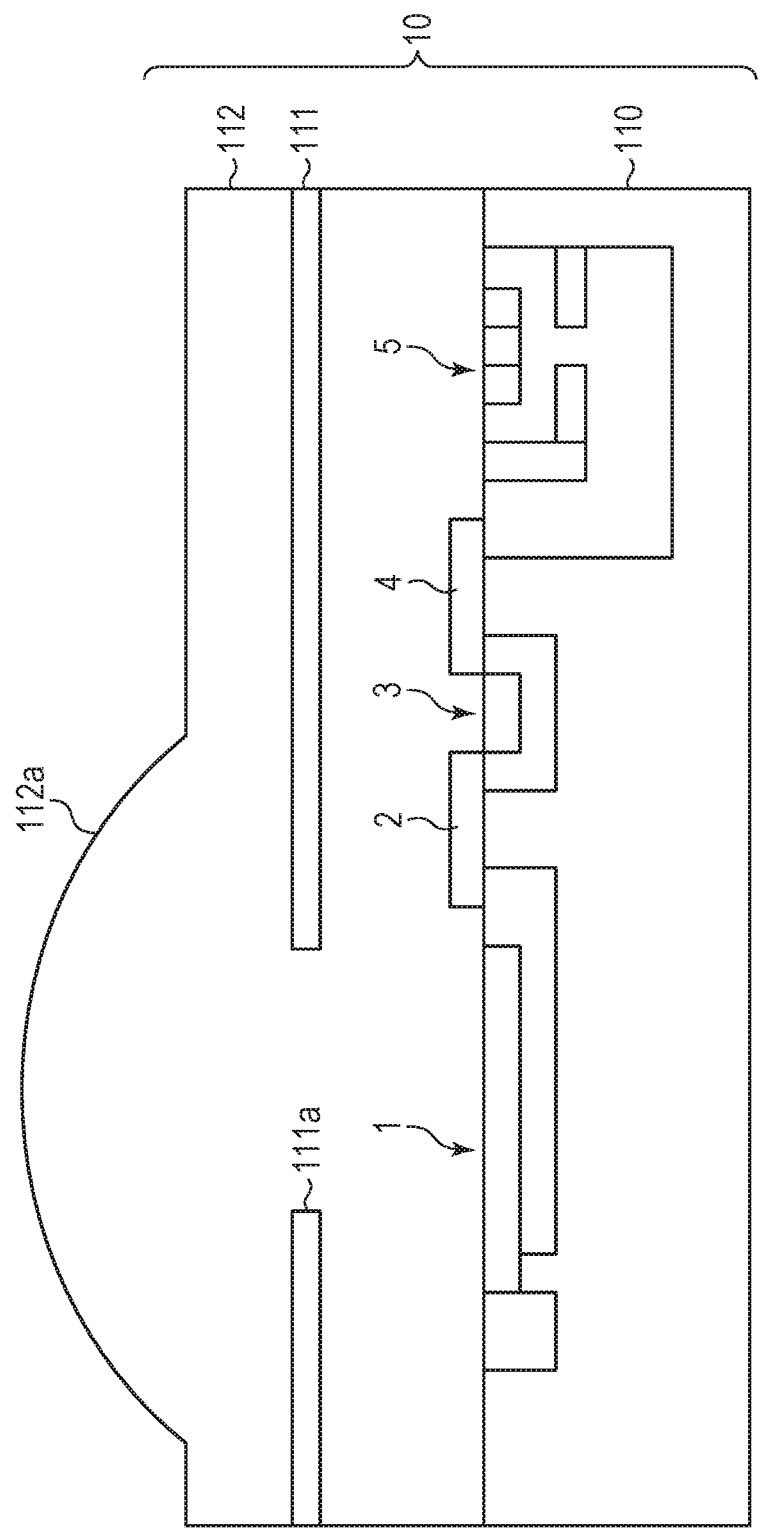
FIG. 13 is a sectional view of a photoelectric conversion element in a sixth embodiment of the present disclosure.

FIG. 13 is a sectional view of a photoelectric conversion element in the present embodiment. In the present embodiment, the light receiving face is provided on the opposite side of the light receiving face of the photoelectric conversion element illustrated in FIG. 7. Features different from those in the first embodiment will be mainly described below.

In FIG. 13, the photoelectric conversion element 101 is formed in the substrate 10, and the substrate 10 includes the P-type semiconductor substrate 110, the light-shielding member 111, and the optical member 112. The photoelectric conversion unit 1, the first transfer gate 2, the charge accumulation unit 3, the second transfer gate 4, and the charge multiplication unit 5 are formed in the semiconductor substrate 110. Furthermore, the light-shielding member 111 is formed above the semiconductor substrate 110 via an interlayer insulating film. The light-shielding member 111 has the opening 111a at a position corresponding to the photoelectric conversion unit 1 in a plan view. The optical member 112 is formed on the light-shielding member 111. The optical member 112 is formed of a transmissive material and may include a micro-lens, a color filter, or the like. The micro-lens collects an incident light from the backside of the substrate 10 and guides the collected light to the photoelectric conversion unit 1 via the opening 111a. The region other than the photoelectric conversion unit 1 is shielded form light by the light-shielding member 111, and no light enters the charge accumulation unit 3 and the charge multiplication unit 5.

The substrate 20 on which pixel signal processing unit 102 is formed may be attached to the underside of the substrate 10, that is, the face on the opposite side of the incidence face (see FIG. 4). The substrate 10 and the substrate 20 are attached at the junction interface. The junction interface is formed of a metal such as copper and an insulating member such as an oxide film.

According to the present embodiment, the light-shielding member 111 and the optical member 112 are formed similarly on the face on which elements such as the photoelectric conversion unit 1 are formed in the semiconductor substrate 110. It is therefore possible to reduce the number of processes in semiconductor manufacturing compared to the first embodiment and reduce the manufacturing cost. Further, when the size of a pixel is large, the pixel signal processing unit 102 such as a counter may be formed on the same face of the semiconductor substrate 110 as the face on which the photoelectric conversion element 101 is formed.

Seventh Embodiment

Figure 14:
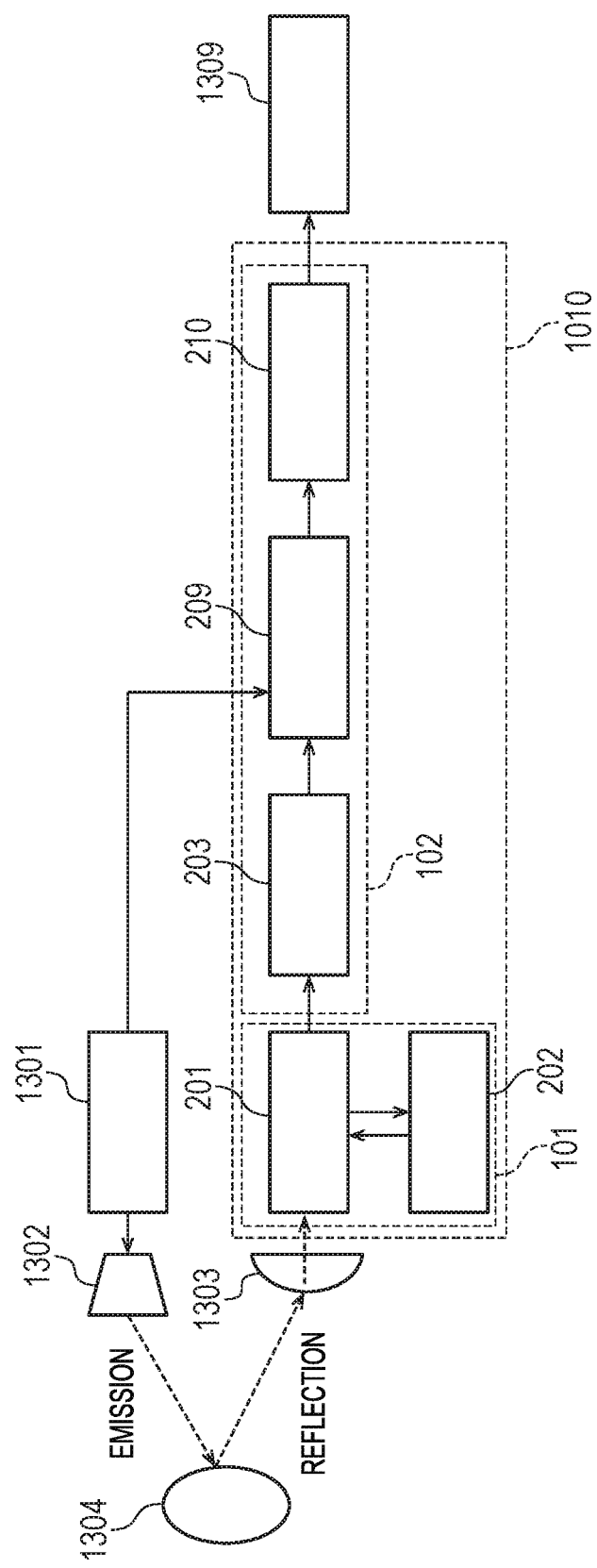
FIG. 14 is a block diagram illustrating a general configuration of an imaging system according to a seventh embodiment of the present disclosure.

An imaging system according to a seventh embodiment of the present disclosure will be described by using FIG. 14. FIG. 14 is a block diagram illustrating a configuration example of the imaging system according to the present embodiment.

In the present embodiment, with reference to FIG. 14, another example of a photo-detection system using the photo-detection device 1010 of the first to sixth embodiments will be described. A component having the same function as that in FIG. 1 to FIG. 13 is labeled with the same reference, and description thereof will be omitted or simplified.

First, with reference to FIG. 14, a distance detection system that is one example of the photo-detection system will be described. Note that the pixel 100 of the present embodiment has a TDC 209 and a memory 210 instead of the counter circuit 204 of FIG. 3.

FIG. 14 is a block diagram of a distance detection system. The distance detection system has a light source control unit 1301, a light emitting unit 1302, an optical member 1303, a photo-detection device 1010, and a distance calculation unit 1309.

The light source control unit 1301 controls driving of the light emitting unit 1302. The light emitting unit 1302 is a light emitting device that emits a light with short pulses (sequence) in the capturing direction in accordance with a signal from the light source control unit 1301.

A light emitted from the light emitting unit 1302 is reflected at a subject 1304. The reflected light is received by a photoelectric conversion unit 201 of the photo-detection device 1010 through the optical member 1303 such as a lens. The photoelectric conversion unit 201 outputs a signal based on an incident light, and the signal is input to the TDC 209 via the inverter circuit 203.

The TDC 209 acquires, from the light source control unit 1301, a signal indicating a timing of light emission from the light emitting unit 1302. The TDC 209 compares a signal acquired from the light source control unit 1301 with a signal input from the inverter circuit 203. Thereby, the TDC 209 outputs, as a digital signal, the time period from the time when the light emitting unit 1302 emits a pulse light to the time when the reflected light reflected by the subject 1304 is received. A digital signal output from the TDC 209 is held in the memory 210. This process is repeated for multiple times, and the memory 210 can hold a digital signal for the multiple times.

The distance calculation unit 1309 calculates a distance from the photo-detection device 1010 to the subject 1304 based on the plurality of digital signals held in the memory 210. Such a distance detection system is applicable to an on-vehicle distance detection device, for example. Note that a process performed by the distance calculation unit 1309 is a process of a digital signal and thus may be more generally referred to as a signal processing unit.

Eighth Embodiment

Figure 15A:
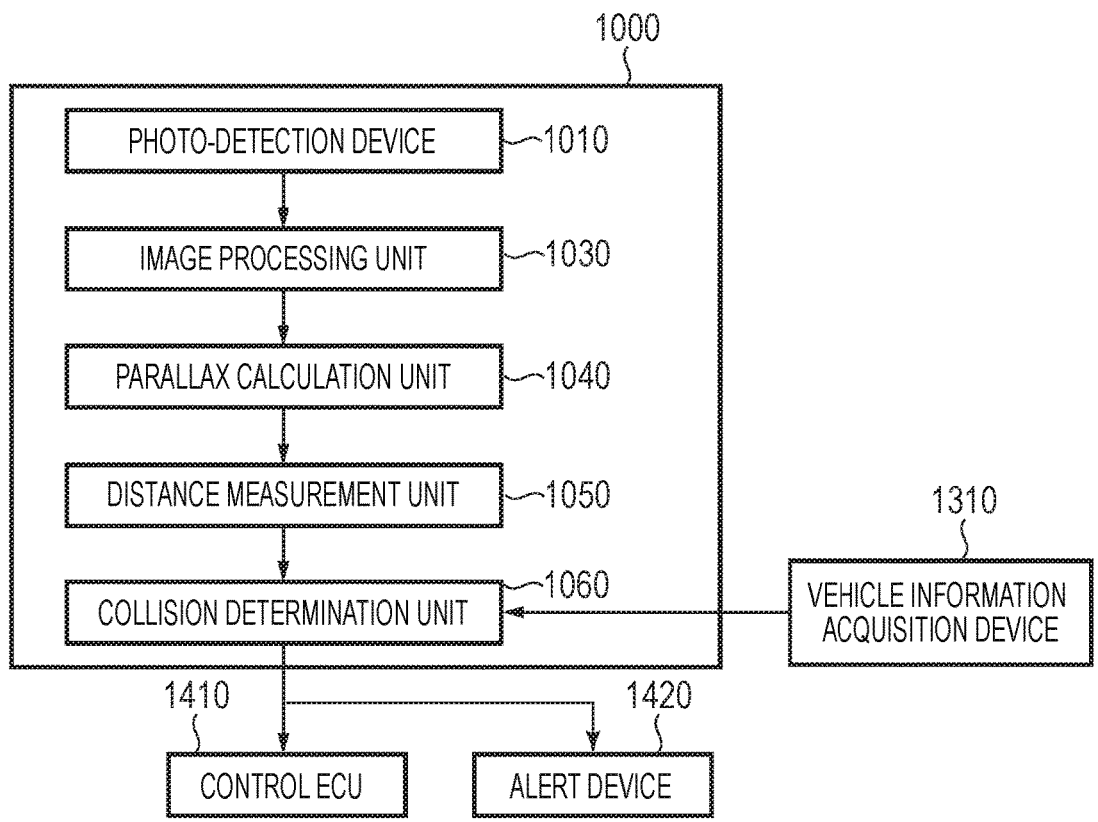
FIG. 15A and FIG. 15B are diagrams illustrating configuration examples of an imaging system and a moving body according to an eighth embodiment of the present disclosure.
Figure 15B:
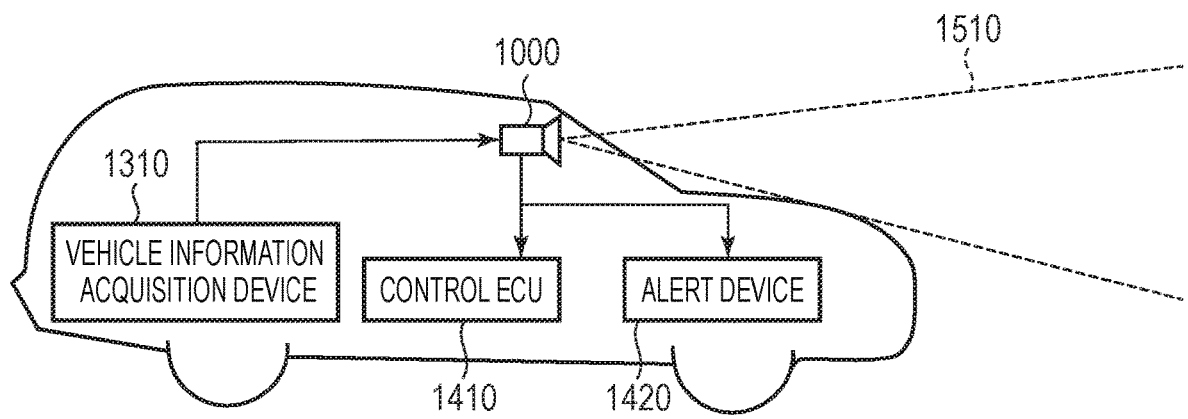

An imaging system and a moving body according to an eighth embodiment of the present disclosure will be described by using FIG. 15A and FIG. 15B. FIG. 15A and FIG. 15B are diagrams illustrating a configuration of a photo-detection system 1000 and a moving body according to the present embodiment.

FIG. 15A is a block diagram illustrating one example of the photo-detection system 1000 related to an on-vehicle camera. The photo-detection system 1000 has the photo-detection device 1010 according to the first embodiment. The photo-detection system 1000 has an image processing unit 1030 that performs image processing on a plurality of digital signals acquired by the photo-detection device 1010. Furthermore, the photo-detection system 1000 has a parallax calculation unit 1040 that calculates a parallax (a phase difference of parallax images) from a plurality of image data acquired by the image processing unit 1030.

Further, the photo-detection system 1000 has a distance measurement unit 1050 that calculates a distance to the object based on the calculated parallax and a collision determination unit 1060 that determines whether or not there is a collision possibility based on the calculated distance. Here, the parallax calculation unit 1040 and the distance measurement unit 1050 are an example of a distance information acquisition unit that acquires distance information on the distance to the object. That is, the distance information is information on a parallax, a defocus amount, a distance to an object, or the like.

The collision determination unit 1060 may use any of the distance information to determine the collision possibility. The distance information acquisition unit may be implemented by dedicatedly designed hardware, may be implemented by a software module, or may be implemented by a combination thereof. Further, the distance information acquisition unit may be implemented by a Field Programmable Gate Array (FPGA), an Application Specific Integrated Circuit (ASIC), or the like or, in addition, may be implemented by a combination thereof.

The photo-detection system 1000 is connected to the vehicle information acquisition device 1310 and can acquire vehicle information such as a vehicle speed, a yaw rate, a steering angle, or the like. Further, the photo-detection system 1000 is connected to a control ECU 1410, which is a control device that outputs a control signal for causing a vehicle to generate braking force based on a determination result by the collision determination unit 1060.

Further, the photo-detection system 1000 is also connected to an alert device 1420 that issues an alert to the driver based on a determination result by the collision determination unit 1060. For example, when the collision probability is high as the determination result of the collision determination unit 1060, the control ECU 1410 performs vehicle control to avoid a collision or reduce damage by applying a brake, pushing back an accelerator, suppressing engine power, or the like. The alert device 1420 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the photo-detection system 1000. FIG. 15B illustrates the photo-detection system 1000 when a front area of a vehicle (a capturing area 1510) is captured. The vehicle information acquisition device 1310 transmits an instruction to the photo-detection system 1000 or the photo-detection device 1010 so as to perform a predetermined operation. With such a configuration, it is possible to further improve the ranging accuracy. The vehicle may further have a control unit that controls the vehicle, which is a moving body, based on the distance information.

Although the example of control for avoiding a collision to another vehicle has been described above, the photo-detection system 1000 is applicable to automatic driving control for following another vehicle, automatic driving control for not going out of a traffic lane, or the like. Furthermore, the photo-detection system 1000 is not limited to a vehicle and can be applied to a moving body (moving apparatus) such as a ship, an airplane, or an industrial robot, for example. In addition, the imaging system can be widely applied to a device which utilizes object recognition, such as an intelligent transportation system (ITS), without being limited to moving body.

According to the present embodiment, by using the photo-detection device 1010 having the improved detection performance, it is possible to provide a photo-detection system and a moving body of higher performance.

Modified Embodiments

The present disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present disclosure.

Embodiments of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Note that all of the embodiments described above are mere embodied examples in implementing the present disclosure, and the technical scope of the present disclosure should not be construed in a limiting sense by these embodiments. That is, the present disclosure can be implemented in various forms without departing from the technical concept or the primary feature thereof.

According to the present disclosure, a photo-detection device and an imaging system that can reduce noise due to unnecessary charges can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-244016, filed Dec. 27, 2018 which is hereby incorporated by reference herein in its entirety.

What is claimed is:
1. A photo-detection device comprising:
  a first semiconductor region that accumulates a signal charge based on an incident light;
  a second semiconductor region that is capable of accumulating a signal charge, the number of signal charges that can be accumulated in the second semiconductor region being less than the number of signal charges that can be accumulated in the first semiconductor region;
  a first gate that transfers the signal charge from the first semiconductor region to the second semiconductor region; and
  a charge multiplication unit that includes a third semiconductor region and avalanche-multiplies the signal charge transferred from the second semiconductor region to the third semiconductor region.

2. The photo-detection device according to claim 1, wherein the second semiconductor region is smaller than the first semiconductor region in a plan view.

3. The photo-detection device according to claim 1, wherein the number of the signal charges that can be accumulated in the second semiconductor region is less than two.

4. The photo-detection device according to claim 1, wherein a period in which the signal charge is transferred from the first semiconductor region to the second semiconductor region and a period in which the signal charge is transferred from the second semiconductor region to the third semiconductor region are shorter than a period in which the signal charge is accumulated in the first semiconductor region, respectively.

5. The photo-detection device according to claim 1, wherein the first gate is arranged so as to overlap a part of the first semiconductor region and a part of the second semiconductor region in a plan view.

6. The photo-detection device according to claim 1, wherein the number of the signal charges simultaneously transferred from the first semiconductor region to the second semiconductor region caused by a change in an electric potential applied to the first gate is less than two.

7. The photo-detection device according to claim 6, wherein an electric potential applied to the first gate changes repeatedly at a predetermined cycle.

8. The photo-detection device according to claim 7, wherein a peak value in each cycle of an electric potential applied to the first gate increases as time elapses.

9. The photo-detection device according to claim 1, wherein in response to a change of an electric potential applied to the first gate, an electric potential of the second semiconductor region changes, and the signal charge is transferred from the second semiconductor region to the charge multiplication unit.

10. The photo-detection device according to claim 1,
  wherein in a period in which an electric potential applied to the first gate changes from a high level to a low level, in response to a change in an electric potential of the second semiconductor region, the signal charge is transferred from the second semiconductor region to the charge multiplication unit, and
  wherein the period is longer than a period in which an electric potential applied to the first gate changes from a low level to a high level.

11. The photo-detection device according to claim 1 further comprising a second gate that is arranged so as to overlap a part of the second semiconductor region and a part of the third semiconductor region in a plan view and transfers the signal charge from the second semiconductor region to the charge multiplication unit.

12. The photo-detection device according to claim 11, wherein the number of the signal charges simultaneously transferred from the second semiconductor region to the charge multiplication unit caused by a change in an electric potential applied to the second gate is less than two.

13. The photo-detection device according to claim 12, wherein an electric potential applied to the first gate and an electric potential applied to the second gate change in accordance with a sinewave.

14. The photo-detection device according to claim 13, wherein an electric potential applied to the second gate changes to be shifted by a predetermined phase with respect to an electric potential applied to the first gate.

15. The photo-detection device according to claim 14, the predetermined phase is a half cycle.

16. The photo-detection device according to claim 11, wherein in a period in which an electric potential applied to the second gate changes from a low level to a high level, the signal charge is transferred from the first semiconductor region to the second semiconductor region, and wherein the period is longer than a period in which an electric potential applied to the second gate changes from a high level to a low level.

17. The photo-detection device according to claim 1, wherein while the first semiconductor region accumulates the signal charge based on the incident light, a level of a reverse bias voltage which does not cause avalanche multiplication in the charge multiplication unit is applied to the third semiconductor region.

18. The photo-detection device according to claim 1 further comprising a pixel signal processing unit including a detection unit that detects an avalanche current arising in the charge multiplication unit and a counter unit that counts the number of times of arising of the avalanche current detected by the detection unit.

19. The photo-detection device according to claim 18 further comprising a first semiconductor substrate and a second semiconductor substrate, wherein the first semiconductor region, the second semiconductor region, the first gate, and the charge multiplication unit are formed on a first primary face of the first semiconductor substrate, wherein an optical member that guides an incident light to the first semiconductor region is formed on a second primary face side of the first semiconductor substrate, and wherein the second semiconductor substrate on which the pixel signal processing unit is formed is provided on a first primary face side of the first semiconductor substrate.

20. The photo-detection device according to claim 18 further comprising a first semiconductor substrate and a second semiconductor substrate, wherein the first semiconductor region, the second semiconductor region, the first gate, and the charge multiplication unit are formed on a first primary face of the first semiconductor substrate, wherein an optical member that guides an incident light to the first semiconductor region is formed on a first primary face side of the first semiconductor substrate, and wherein the second semiconductor substrate on which the pixel signal processing unit is formed is provided on a second primary face side of the first semiconductor substrate.

21. An imaging system comprising:

the photo-detection device according to claim 1; and a signal processing unit that processes a signal output from the photo-detection device.

22. A moving body comprising:

the photo-detection device according to claim 1;

a distance information acquisition unit that acquires distance information on a distance to an object, from a parallax image based on signals from the photo-detection device; and a control unit that controls the moving body based on the distance information.

* * * * *